United States Patent
Wildermuth et al.

(10) Patent No.: US 9,291,650 B2
(45) Date of Patent: *Mar. 22, 2016

(54) HIGH-VOLTAGE SENSOR WITH AXIALLY OVERLAPPING ELECTRODES

(71) Applicant: ABB RESEARCH LTD, Zurich (CH)

(72) Inventors: Stephan Wildermuth, Mülligen (CH); Klaus Bohnert, Oberrohrdorf (CH); Norbert Koch, Dietikon (CH); Jan Czyzewski, Adliswil (CH); Sergio Vincenzo Marchese, Zurich (CH)

(73) Assignee: ABB RESEARCH LTD, Zürich (CH)

( * ) Notice: Subject to any disclaimer, the term of this patent is extended or adjusted under 35 U.S.C. 154(b) by 469 days.

This patent is subject to a terminal disclaimer.

(21) Appl. No.: 13/707,263

(22) Filed: Dec. 6, 2012

(65) Prior Publication Data
US 2013/0099773 A1      Apr. 25, 2013

Related U.S. Application Data

(63) Continuation of application No. PCT/EP2011/059399, filed on Jun. 7, 2011.

(51) Int. Cl.
G01R 31/00 (2006.01)
G01R 19/00 (2006.01)
G01R 15/24 (2006.01)

(52) U.S. Cl.
CPC .......... *G01R 19/0046* (2013.01); *G01R 15/242* (2013.01)

(58) Field of Classification Search
CPC ............ G01R 15/241–15/247; G01R 19/0046; G01R 1/071
USPC ........................................................... 324/96
See application file for complete search history.

(56) References Cited

U.S. PATENT DOCUMENTS 2,288,969 A * 7/1942 Kirkwood ..................... 174/143
3,462,545 A   8/1969 Grimmer
(Continued)

FOREIGN PATENT DOCUMENTS

CH       547 496 A      3/1974
CH       547496    *    3/1974
(Continued)

OTHER PUBLICATIONS

International Search Report (PCT/ISA/210) issued on Aug. 10, 2011, by the European Patent Office as the International Searching Authority for International Application No. PCT/EP2011/055408.
(Continued)

*Primary Examiner* — Daniel Miller
(74) *Attorney, Agent, or Firm* — Buchanan Ingersoll & Rooney PC

(57) ABSTRACT

A voltage sensor includes an insulator with mutually insulated electrodes embedded therein. The electrodes are coaxial and cylindrical and overlap axially along part of their lengths. They are mutually staggered and control the surfaces of electric equipotential such that there is a substantially homogeneous electric field outside the insulator and a substantially homogeneous but higher field within a sensing cavity within the insulator. A field sensor is arranged within the sensing cavity to measure the field. This design allows for the production of compact voltage sensors for high voltage applications.

52 Claims, 12 Drawing Sheets

(a)

(b)

(56) References Cited

U.S. PATENT DOCUMENTS

| | | | |
|---|---|---|---|
| 3,875,327 A | | 4/1975 | Hildenbrand |
| 4,362,897 A | | 12/1982 | Matthaus et al. |
| 4,370,514 A | * | 1/1983 | Matthaus et al. ............ 174/31 R |
| 4,904,931 A | | 2/1990 | Miller |
| 4,929,830 A | | 5/1990 | Bohnert et al. |
| 5,001,419 A | | 3/1991 | Miller |
| 5,029,273 A | | 7/1991 | Jaeger |
| 5,339,026 A | | 8/1994 | Bohnert |
| 5,715,058 A | | 2/1998 | Bohnert et al. |
| 5,936,395 A | | 8/1999 | Kevorkian et al. |
| 6,140,810 A | | 10/2000 | Bohnert et al. |
| 6,252,388 B1 | | 6/2001 | Jaeger et al. |
| 6,348,786 B1 | | 2/2002 | Bjarme et al. |
| 6,380,725 B1 | | 4/2002 | Chavez et al. |
| 6,876,188 B2 | | 4/2005 | Bohnert et al. |
| 7,123,032 B2 | * | 10/2006 | Yakymyshyn et al. ....... 324/705 |
| 2009/0289617 A1 | | 11/2009 | Bohnert |
| 2010/0109642 A1 | | 5/2010 | Sato et al. |
| 2010/0283451 A1 | | 11/2010 | Mitrofanov |

FOREIGN PATENT DOCUMENTS

| | | |
|---|---|---|
| DE | 198 38 354 A1 | 2/2000 |
| EP | 0 316 635 A1 | 5/1989 |
| EP | 0 316 619 B1 | 12/1993 |
| EP | 0 789 245 A2 | 8/1997 |
| EP | 1 154 278 B1 | 10/2004 |
| EP | 1 939 897 A1 | 7/2008 |
| EP | 2 138 853 A1 | 12/2009 |
| WO | WO 98/05975 A1 | 2/1998 |
| WO | WO 2004/086064 A1 | 10/2004 |
| WO | WO 2007/121592 A1 | 11/2007 |
| WO | WO 2008/077255 A1 | 7/2008 |
| WO | WO 2009/138120 A1 | 11/2009 |

OTHER PUBLICATIONS

Written Opinion (PCT/ISA/237) issued on Aug. 10, 2011, by the European Patent Office as the International Searching Authority for International Application No. PCT/EP2011/055408.

International Preliminary Report on Patentability (PCT/IPEA/409) issued on Jun. 21, 2012, by the European Patent Office as the International Searching Authority for International Application No. PCT/EP2011/055408.

Bohnert et al., "Optical fiber sensors for the electric power industry", Optics and Lasers in Engineering, Mar. 2005, pp. 511-526, vol. 43, No. 3-5.

Cole et al., "Synthetic-Heterodyne Interferometric Demodulation", IEEE Journal of Quantum Electronics, Apr. 1982, pp. 694-697, vol. QE-18, No. 4.

Urbanczyk et al., "Digital demodulation system for low-coherence interferometric sensors based on highly birefringent fibers", Applied Optics, Dec. 2001, pp. 6618-6625, vol. 40, No. 36.

Campbell et al., "A frequency-modulated continuous wave birefringent fibre-optic strain sensor based on a Sagnac ring configuaration", Meas. Sci. Technol., 1999 (month unknown), pp. 218-224.

Williams et al., "Optical, thermo-optic, electro-optic, and photoelastic properties of bismuth germanate ($Bi_4Ge_3O_{12}$)", Applied Optics, Jul. 1996, pp. 3562-3569, vol. 35, No. 19.

Massey et al., Electromagnetic field components"their measurement using linear electrooptic and magnetooptic effects", Applied Optics, Nov. 1975, pp. 2712-2719, vol. 14, No. 11.

Frosio et al., "Reciprocal reflection interferometer for a fiber-optic Faraday current sensor", Applied Optics, Sep. 1994, pp. 6111-6122, vol. 33, No. 25.

Lawrence, "Lithium niobate integrated optics", Rep. Prog. Phys., 1993 (month unknown), pp. 363-429.

Lee et al., "Electromagnetic Field Sensor using Mach-Zehnder Waveguide Modulator", Microwave and Optical Technology Letters, Sep. 2006, pp. 1897-1899, vol. 48, No. 9.

Meyer et al., "Reversibility of photoinduced birefringence in ultralow-birefringence fibers", Optics Letters, Oct. 1996, pp. 1661-1663, vol. 21, No. 20.

International Preliminary Report on Patentability (PCT/IB/373) issued on Dec. 10, 2012, by the European Patent Office as the International Searching Authority for International Application No. PCT/EP2011/059399.

Lionel Duvillaret et al., "Electro-Optic Sensors for Electric Field Measurements. II. Choice of the Crystals and Complete Optimization of Their Orientation", J. Opt. Soc. Am. B, vol. 19, No. 11, Nov. 2002, pp. 2704-2715.

Nicolas A.F. Jaeger et al., "Integrated Optics Pockels Cell High-Voltage Sensor", IEEE Transactions on Power Delivery, vol. 10, No. 1, Jan. 1995, pp. 127-134.

Klaus Bohnert et al., "Fiber Optic Voltage Sensor for 420 kV Electric Power Systems", Opt. Eng., vol. 39, No. 11, pp. 3060-3067, Nov. 2000.

International Search Report (PCT/ISA/210) issued on Sep. 5, 2011, by the European Patent Office as the International Searching Authority for International Application No. PCT/EP2011/059399.

* cited by examiner

HIGH-VOLTAGE SENSOR WITH AXIALLY OVERLAPPING ELECTRODES

RELATED APPLICATION(S)

This application claims priority as a continuation application under 35 U.S.C. §120 to PCT/EP2011/059399, which was filed as an International Application on Jun. 7, 2011, designating the U.S., and which claims priority to International Application PCT/EP2010/057872 filed on Jun. 7, 2010. The entire contents of these applications are hereby incorporated by reference in their entireties.

FIELD

The present disclosure relates to a voltage sensor for measuring a voltage between a first and a second contact point. More particularly, the present disclosure relates to a voltage sensor with an insulator, such as a body of an insulating material, extending between the contact points and with electrodes arranged in the body. The present disclosure also relates to an assembly of several such voltage sensors arranged in series.

BACKGROUND INFORMATION

In the following description, publications referenced herein are identified with bracketed numbers (e.g., [1]) which refer to the list of references identified in the List of References following the description. Optical high-voltage sensors often rely on the electro-optic effect (Pockels effect) in crystalline materials such as $Bi_4Ge_3O_{12}$ (BGO) [1]. An applied voltage introduces a differential optical phase shift between two orthogonal, linearly polarized light waves propagating through the crystal. This phase shift is proportional to the voltage. At the end of the crystal, the light waves commonly interfere at a polarizer. The resulting light intensity serves as a measure for the phase shift and thus the voltage.

U.S. Pat. No. 4,904,931 [2] and U.S. Pat. No. 6,252,388 [3] disclose a sensor in which the full line voltage (up to several 100 kV) is applied over the length of a single BGO crystal. The crystal length is generally between 100 mm and 250 mm. An advantage is that the sensor signal corresponds to the true voltage, that is, the line integral of the electric field along the crystal. However, the electric field strengths at the crystal are very high. In order to obtain sufficient dielectric strength, the crystal is mounted in a hollow high-voltage insulator made of fiber-reinforced epoxy filled with $SF_6$ gas under pressure for electric insulation. The electrodes at the crystal ends are designed so that the field along the crystal is reasonably homogeneous. The insulator diameter is sufficiently large to keep the field strength in the air outside the insulator below critical limits. The field strength generally decreases with increasing radial distance from the crystal.

U.S. Pat. No. 6,252,388 [4] discloses a voltage sensor which uses several small electro-optical crystals mounted at selected positions along the longitudinal axis of a hollow high-voltage insulator. The crystals measure the electric fields at their locations. The sum of these local field measurements serves as an approximation of the voltage applied to the insulator. Here, the field strengths at a given voltage are significantly lower than with the design of [2] and insulation with nitrogen at atmospheric pressure is sufficient. However, since the sensor does not measure the line integral of the field but derives the signal from the field strengths at a few selected points between ground and high voltage, extra measures (permittivity-shielding) to stabilize the electric field distribution are necessary to avoid excessive approximation errors [5].

A drawback of the above concepts is the requirement of an expensive high-voltage insulator of large size. The outer dimensions are similar to the ones of corresponding conventional inductive voltage transformers or capacitive voltage dividers. Thus, the attractiveness of such optical sensors is limited.

Ref. [6] discloses a sensor in which the voltage is partitioned among several quartz crystals, each with a length of 150 mm, for example. Here, the piezo-electric deformation of the crystals under the applied voltage is transmitted to an optical fiber, which carries at least two different light modes. The light waves travelling through the fiber experience a differential optical phase shift in proportion to the voltage. The ends of each crystal are again equipped with electrodes that provide a relatively homogenous field distribution at the crystals. The electrodes of adjacent crystals are interconnected with electric conductors. The voltage partitioning reduces the electric field strengths compared to a solution with a single crystal and thus makes it possible to mount the crystals in a relatively slender high-voltage insulator of relatively low cost. The hollow volume of the insulator is filled with soft polyurethane. A drawback is that relatively large corona rings are required in order to ensure that the voltage drops at the individual crystals are of comparable magnitude. Furthermore, enhanced electric field strengths occur particularly at the outer surface of the insulator near the positions of the individual electrodes: The peak fields must be kept below the breakdown field of air and therefore prevent still smaller insulator diameter.

Ref. [7] describes an electro-optical voltage sensor of the type as in [2, 3], but with an electro-optic crystal embedded in silicone. A hollow high-voltage insulator of large size and $SF_6$-gas insulation is thus avoided. As in [6] the voltage may be partitioned among several crystals.

Other prior art is a concept as known from high-voltage bushings. There is often a need in high-voltage systems to pass high-voltage conductors through or near by other conductive parts which are at ground potential (for example at power transformers). For this purpose the high-voltage conductor is contained within a feed-through insulator. The insulator contains several layers of metal foil concentric with the high-voltage conductor and insulated from each other. By appropriately choosing the length of the individual cylinders of metal foils, the distribution of the electric field within and near the bushing can be controlled in such a way that a relatively homogeneous voltage drop from high-voltage to ground potential occurs along the outer surface of the bushing [8, 9, 10].

SUMMARY

An exemplary embodiment of the present disclosure provides a high-voltage sensor for measuring a voltage between a first contact point and a second contact point. The exemplary high-voltage sensor includes an insulator of an insulating material extending along an axial direction between the first and the second contact points. The insulator includes at least one sensing cavity. The exemplary high-voltage sensor also includes a plurality of conductive electrodes arranged in the insulator. The conductive electrodes are mutually separated by the insulating material and capacitively coupled to each other. In addition, the exemplary high-voltage sensor includes at least one electric field sensor arranged in the at least one sensing cavity of the insulator. For at least part of the conductive electrodes, each conductive electrode axially overlaps at least one other one of the electrodes. The conductive electrodes are configured to generate an electric field in the sensing cavity having a mean field strength larger than a voltage divided by a distance between the first contact point and the second contact point.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Figure 1:
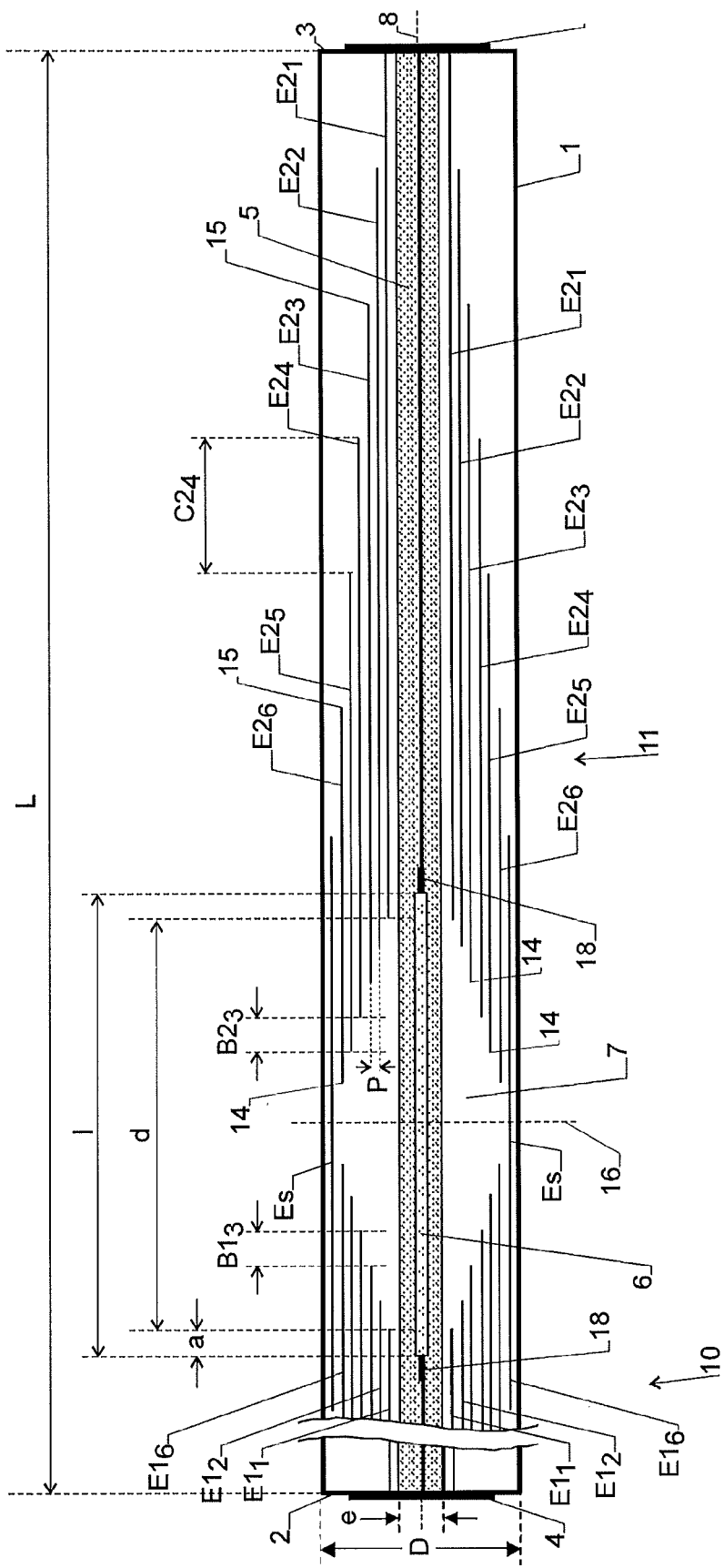
FIG. 1 is a sectional view of a voltage sensor according to an exemplary embodiment of the present disclosure.

Exemplary embodiments of the present provide a voltage sensor for measuring a voltage between a first contact point and a second contact point of alternative design.

An exemplary embodiment of the present disclosure provides a high-voltage sensor for measuring a voltage between a first contact point and a second contact point. The high-voltage sensor includes an insulator, or briefly, a sensor insulator. The insulator is elongate and extends along an axial direction between the first and second contact points. An electric field sensor is arranged within at least one sensing cavity, for example, within exactly one sensing cavity, inside the insulator. In accordance with an exemplary embodiment, the length of the sensing cavity is significantly shorter than the length of the insulator. Further, a plurality of conductive electrodes is arranged in the insulator. The electrodes are mutually separated by the insulating material and capacitively coupled to each other. At least a subset of the electrodes (or the whole set of the electrodes) is arranged such that each electrode of the subset axially overlaps at least another one of the electrodes from the subset.

The electrodes allow to control the surfaces of electric equipotential such that on the outer surface of the insulator the voltage drops over the full length of the insulator while inside the insulator the voltage drops over the (e.g., shorter) length of the sensing cavity. In accordance with an exemplary embodiment, the voltage drops essentially homogeneously both along the outer surface of the insulator and over the length of the sensing cavity.

Whereas in the absence of the voltage sensor, the normal to the surfaces of equipotential is essentially parallel to the axial direction, the normal is perpendicular to the axial direction in the vicinity of the electrodes if such electrodes are present.

The electrodes allow to concentrate the electric field within the sensing cavity with a field strength larger than the (average) field strength at the outside of the voltage sensor, for example, larger than the voltage between the contact points divided by the distance between the contact points.

In accordance with an exemplary embodiment, at least one of the electrodes is a shield electrode radially surrounding the sensing cavity. The electrode can capacitively be coupled to two subsets of electrodes and it prevents the high electric field within the sensing cavity from extending into the air outside the sensor.

In accordance with an exemplary embodiment, the voltage sensor includes two sets of mutually staggered electrodes.

The present disclosure in its exemplary embodiments provides a high-voltage sensor with a slender and light-weight insulator of low cost. The electrodes provide electric field steering and, optionally, obviate the need for electrodes directly applied to the field sensor. A solid-state insulation may suffice (no oil or gas).

The present disclosure also relates to an assembly of such high-voltage sensors in series. Hence, a combination of several modules of the same or differently shaped or dimensioned high-voltage sensor can be used for measuring a large range of different voltage levels.

Other exemplary embodiments are listed in the dependent claims as well as in the description below.

DEFINITIONS

The term "high voltage" designates voltages exceeding 10 kV, for example, exceeding 100 kV.

The terms "radial" and "axial" are understood with respect to the axial direction (along axis 8, z-axis) of the sensor, with radial designating a direction perpendicular to the axial direction and axial designating a direction parallel to the axial direction.

A given electrode "axially overlapping" another electrode indicates that there is a range of axial coordinates (z-coordinates) that the two electrodes have in common.

Voltage Sensor with Electric Field Steering

FIG. 1 shows an exemplary embodiment of a voltage sensor according to the present disclosure. The present embodiment includes an elongate, for example, rod-shaped body of an insulating material forming an insulator 1, briefly named sensor insulator 1, such as epoxy resin or paper impregnated with epoxy resin. Insulator 1 extends between a first contact point 2 and a second contact point 3, both of which may be equipped with metal contacts 4 for contacting neighboring voltage sensors or voltage potentials. In the present embodiment, insulator 1 is cylindrical. Insulator 1 has a central bore 5 filled with a filler material.

An electric field sensor 6, in the present embodiment an optical field sensor, such as a cylinder-shaped crystal of $Bi_4Ge_3O_{12}$ (BGO) or $Bi_4Si_3O_{12}$ (BSO), is placed inside bore 5 within a sensing cavity 7. Sensing cavity 7 may be at a center between first contact point 2 and second contact point 3 in order to minimize the distortion of the electrical field around the voltage sensor.

A reference plane 16 perpendicular to axis 8 of the device and arranged at the center of sensing cavity 7 is used in the following as a geometric reference for describing the geometry of some of the electrodes. Note that here it is assumed that sensing cavity 7 is located in the middle between contact points 2 and 3. Asymmetric positions of sensing cavity 7 will be briefly considered further below. Further, it is noted that the term "cavity" does not imply that there is an absence of insulating material in the respective region.

A plurality of electrodes E is arranged in insulator 1. The electrodes E are mutually separated by the insulating material of insulator 1 and capacitively coupled to each other. In the present embodiment, the electrodes E are formed by metal cylinders (composed of, for example, thin aluminum foil) of different axial extensions concentric to longitudinal axis 8. The electrodes E control the surfaces of equipotential and the distribution of the electric field outside and inside insulator 1. The lengths (e.g., axial extensions) of the individual electrodes E and their radial and axial positions are chosen such that the surfaces of equipotential are spaced essentially equidistantly along the full length of the outer surface of insulator 1 and are concentrated, but again with essentially equal distances, in sensing cavity 7. As a result the applied voltage V drops uniformly along the outer rod surface as well as along the sensing cavity. In accordance with an exemplary embodiment, the length of the field sensor is such that the sensor is essentially exposed to full voltage drop, for example, the sensor length is at least the length of the sensing cavity.

At least one of the electrodes E is a shield electrode Es and radially surrounds sensing cavity 7, thereby capacitively coupling the two sets of electrodes that are separated by reference plane 16.

One electrode, designated E11, is electrically connected to first contact point 2, and subsequently called the "first primary electrode". Another electrode, designated E21, is electrically connected to second contact point 3, and subsequently called the "second primary electrode". These two electrodes carry the potential of the contact points 2 and 3, respectively. The other electrodes form a capacitive voltage divider between the two primary electrodes and therefore are at intermediate potentials.

In addition to shield electrode Es, the electrodes include a first set of electrodes, named $E1_i$ with i=1 ... N1, and a second set of electrodes, named $E2i$ with i=1 ... N2, with second index i being or running independently from the first index i.

For symmetry reasons, N1 may equal N2. In the exemplary embodiment of FIG. 1, N1=N2=6, but the actual number of electrodes may vary.

The electrodes $E1_i$ of the first set are arranged in a first region 10 of insulator 1, which extends from the center of sensing cavity 7 to first contact point 2, while the electrodes $E2_i$ of the second set are arranged in a second region 11 of insulator 1, which extends from the center of sensing cavity 7 to second contact point 3.

Electrode $E1_1$ of the first set of electrodes forms the first primary electrode, and electrode $E2_1$ of the second set forms the second primary electrode. These electrodes are radially closest to longitudinal axis 8, with the other electrodes being arranged at larger distances from longitudinal axis 8.

As mentioned above, the various electrodes overlap in the axial direction and are of a generally "staggered" design. In accordance with an exemplary embodiment, one or more of the following characteristics are used:

For each set j (j=1 or 2) of electrodes, the electrodes $Ej_i$ and $Ej_{i+1}$ axially overlap along an "overlapping section". In this overlapping section, the electrode $Ej_{i+1}$ is arranged radially outside from the electrode $Ej_i$.

For each set j of electrodes:

Each electrode has a center end (as illustrated by reference number 14 for some of the electrodes in FIG. 1) facing reference plane 16 of the sensor and a contact end (as illustrated by reference number 15) axially opposite to center end 14.

Center end 14 of electrode $Ej_{i+1}$ is closer to reference plane 16 than center end 14 of the electrode $Ej_i$, and contact end 15 of electrode $Ej_{i+1}$ is closer to reference plane 16 than contact end 15 of the electrode $Ej_i$, hence electrode $Ej_{i+1}$ is shifted axially towards the center as compared to electrode $Ej_i$, and $Ej_{i+1}$ is shifted radially towards the outside as compared to $Ej_i$.

Contact end 15 of the electrode $Ej_{i+1}$ has an axial distance $Cj_i$ from contact end 15 of the electrode $Ej_i$, and center end 14 of electrode $Ej_{i+1}$ has an axial distance $Bj_i$ from center end 14 of electrode $Ej_i$.

The electrodes $Ej_i$ and $Ej_{i+1}$ axially overlap between contact end 14 of electrode $Ej_{i+1}$ and center end 14 of electrode $Ej_i$.

The distances $Bj_i$ and $Cj_i$ can be optimized according to the desired field design. For example, for obtaining a stronger field within sensing cavity 7 than outside the voltage sensor, the axial distance $Bj_i$ can be chosen to be smaller than the corresponding axial distance $Cj_i$, for all i and j.

For most designs, if a homogeneous field is desired in sensing cavity 7, the axial distances $Bj_i$ should be substantially equal to a common distance B, for example, they can all be the same. Similarly, if a homogeneous field is desired at the surface and outside the voltage sensor, the axial distances $Cj_i$ may be substantially equal to a common distance C, for example, they can also all be the same.

In accordance with an exemplary embodiment, shield electrode Es can have an axial overlap with at least one electrode of the first set and also with at least one electrode of the second set. This, on the one hand, provides improved protection against the high electrical fields in sensing cavity 7 reaching to the surface of the device. On the other hand, it provides good capacitive coupling between the two sets of electrodes via the shield electrode, thereby decreasing the corresponding voltage drop. To further improve this capacitive coupling as well as the field homogeneity within sensing cavity 7, shield electrode Es can have an axial overlap with the radially outmost electrode E16 of the first set and the radially outmost electrode E26 of the second side and is arranged radially outside from these outmost electrodes E16 and E26.

According to an exemplary embodiment, in order to evenly distribute the fields outside and inside the voltage sensor, the electrodes can be arranged symmetrically with respect to reference plane 16 of the device.

For the same reason, the electrodes can be cylindrical and/or coaxial to each other, for example, coaxial with the longitudinal axis 8.

FIG. 1 further illustrates some other advantageous aspects:

Field sensor 6 (which is, for example, an electro-optical crystal) can be cylindrical with a length l and is positioned in central bore 5 (diameter e) of insulator 1 (outer diameter D and length L), and within sensing cavity 7.

Insulator 1 contains, as an example, six electrodes in both the first and the second set. These electrodes $Ej_i$, as well as shield electrode Es, can be of a metal foil, concentric with field sensor 6 and insulator 1.

With $Bj_i$ and $Cj_i$ chosen as described above, in accordance with an exemplary embodiment, the electrodes of the two sets are equally spaced in radial direction with a uniform separation distance P between neighboring electrodes, and also the radial distance between the outmost electrodes E16, E26 of each set to shield electrode Es is equal to P. Again, this contributes to distribute the electrical fields more evenly both inside and outside insulator 1.

In accordance with an exemplary embodiment, the innermost, primary electrodes E11 and E21 protrude over the axial ends of field sensor 6 by a length a, for example, field sensor 6 axially overlaps with both primary electrodes. The length a is advantageously sufficiently large so that the field strength in the immediate vicinity of the ends of field sensor 6 and beyond is essentially zero, for example, field sensor 6 is exposed to the full voltage applied between contact points 2 and 3.

In accordance with an exemplary embodiment, shield electrode Es is positioned at mid-distance between the contact ends 2, 3.

The primary electrodes E11 and E21 are in contact with the two electric potentials, for example, ground and high-voltage potentials, at the corresponding contact points 2, 3 by means of the metal contacts 4.

In accordance with an exemplary embodiment, insulator 1 is equipped with sheds 19, composed of silicone, for example, on its outer surface, which provide increased creep distance between high-voltage and ground potential for outdoor operation and, for example, for high-voltage operation.

The field steering by the electrodes $Ej_i$ and Es avoids excessive local peak fields both outside and inside insulator 1. As a result, the radial dimensions of insulator 1 can be made relatively small without the danger of electric breakdown in the environmental air.

The electric field strength in the immediate vicinity of the two ends of field sensor 6 is essentially zero. The same is true within the bore 5 below and above the sensing element. As a benefit, any components, for example, any optical components if an optical field sensor is used, are in a field-free region. This is especially advantageous if an optical field sensor is used, because the various auxiliary optical components, such as retarders, polarizers, and collimators 18, can be located in a field-free environment. See also FIG. 12.

There is no need for field steering electrodes at the crystal ends, which simplifies the sensor assembly. The primary electrodes E1$_1$ and E2$_1$ are in electric contact with the contact points 2, 3 (for example, ground and high voltage potential). The other electrodes are on intermediary potentials generated by the capacitive voltage divider formed by the electrodes.

Bore 5 is filled with a soft material, for example, silicone, which provides sufficient dielectric strength. The silicone contains a filler material which ascertains sufficient compressibility and accommodates any thermal expansion of the silicone and insulator 1. The filler may, for example, include micron sized beads made of a soft material or of tiny gas bubbles (such as $SF_6$ gas). The silicone may also serve to hold the field sensor 6 in place and suppress effects of mechanical shock and vibration.

Due to its light weight, the voltage sensor may be suspension-mounted in a high-voltage substation.

The dimensions of the voltage sensor and its parts depend on the rated voltage and are chosen such that the sensor meets the requirements of relevant standards for over-voltages, lightning and switching impulse voltages (e.g., Ref. 17). For example, insulator 1 of a 125 kV-module may be an epoxy rod having an overall length L of about 1 m to 1.5 m and a diameter D of 50 mm to 80 mm. The crystal may have a length l of 150 mm and a diameter d of 5 mm. The inner bore 5 of the rod may then have a diameter e between 15 and 25 mm. The parameters a, $Bi_j$, $Ci_j$, D, P are chosen such that the voltage applied to the rod ends drops as uniformly as possible over the length of the crystal within the bore and at the same time over the full length of the epoxy rod at its outer surface. The design may be optimized by using an adequate numerical electric-field simulation tool.

Choosing the distances $Bi_j$ as well as $Cij$ to be equal as described above also contributes to simple and cost efficient insulator fabrication.

FIG. 1 illustrates but one possible design of the electrodes. It must be noted that, depending on the required size and shape of the sensor, the design of the electrodes may vary.

For example, the electrodes may also be non-cylindrical, for example, by having an oval cross section or by having varying diameter. The electrodes may, for example, be truncated conical (frustro-conical), their end sections 15 may be flared outwards, or their end-sections 14 may be flared inwards.

Each electrode can include a continuous conductive sheet, such as a metal foil, or it may, for example, be perforated or have gaps.

Modular Design

Figure 2:
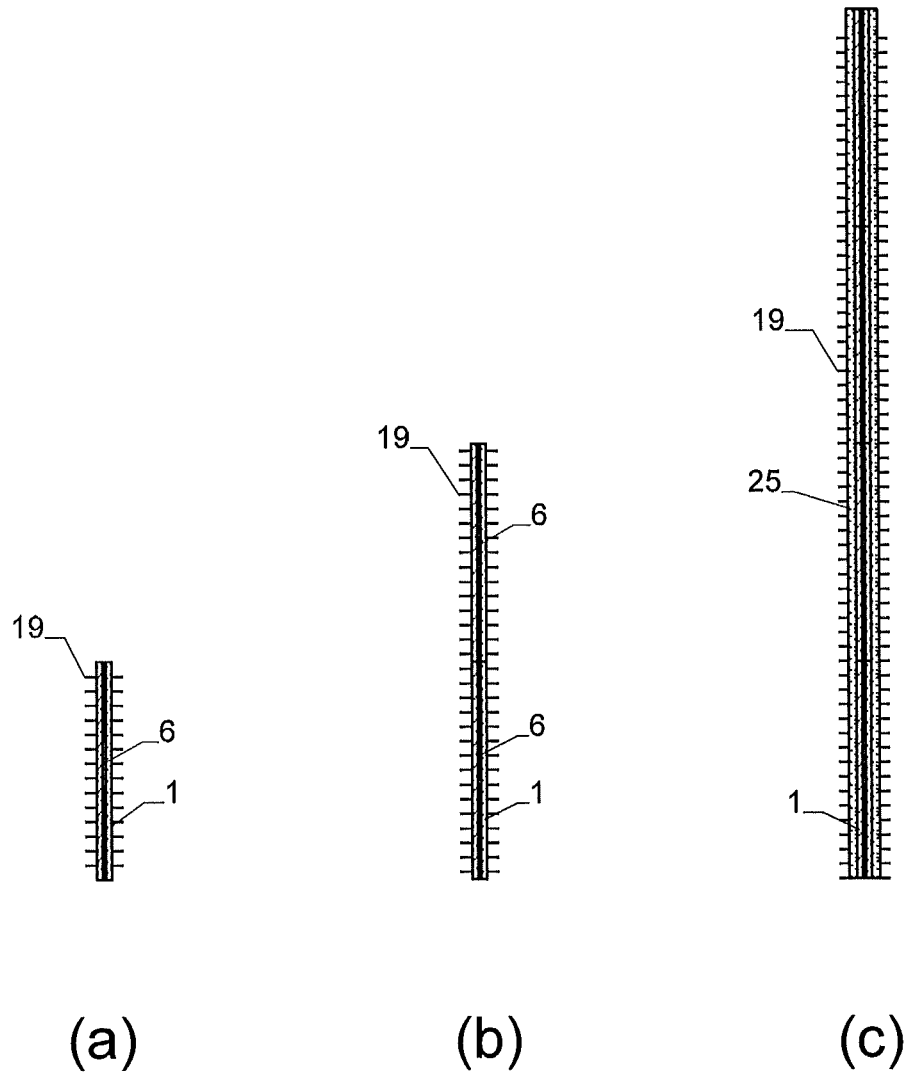
FIG. 2 shows (a) a single voltage sensor as well as assemblies of two (b) and four (c) voltage sensors, according to an exemplary embodiment of the present disclosure.

The voltage sensor described above may form a module in an assembly of several voltage sensors arranged in series, such as shown in FIG. 2a. In accordance with an exemplary embodiment, a module containing a single field sensor 6 as described above may be designed for a rated voltage of, for example, 125 kV or 240 kV. FIG. 2a also shows schematically the sheds 19 applied to the outside of insulator 1.

For operation at 240 kV, two 125 kV modules may be mounted in series (FIG. 2b). The primary electrodes E2$_1$ and E1$_2$ of the neighbouring modules are in electric contact at the joint between the two modules. The voltage is then about evenly partitioned on the two field sensors 6. Alternatively, a single continuous insulator (with a length of about twice the length of the individual rods) which contains two field sensors 6 and two corresponding assemblies of field steering electrodes may be used instead of two separate epoxy rods.

Figure 9:
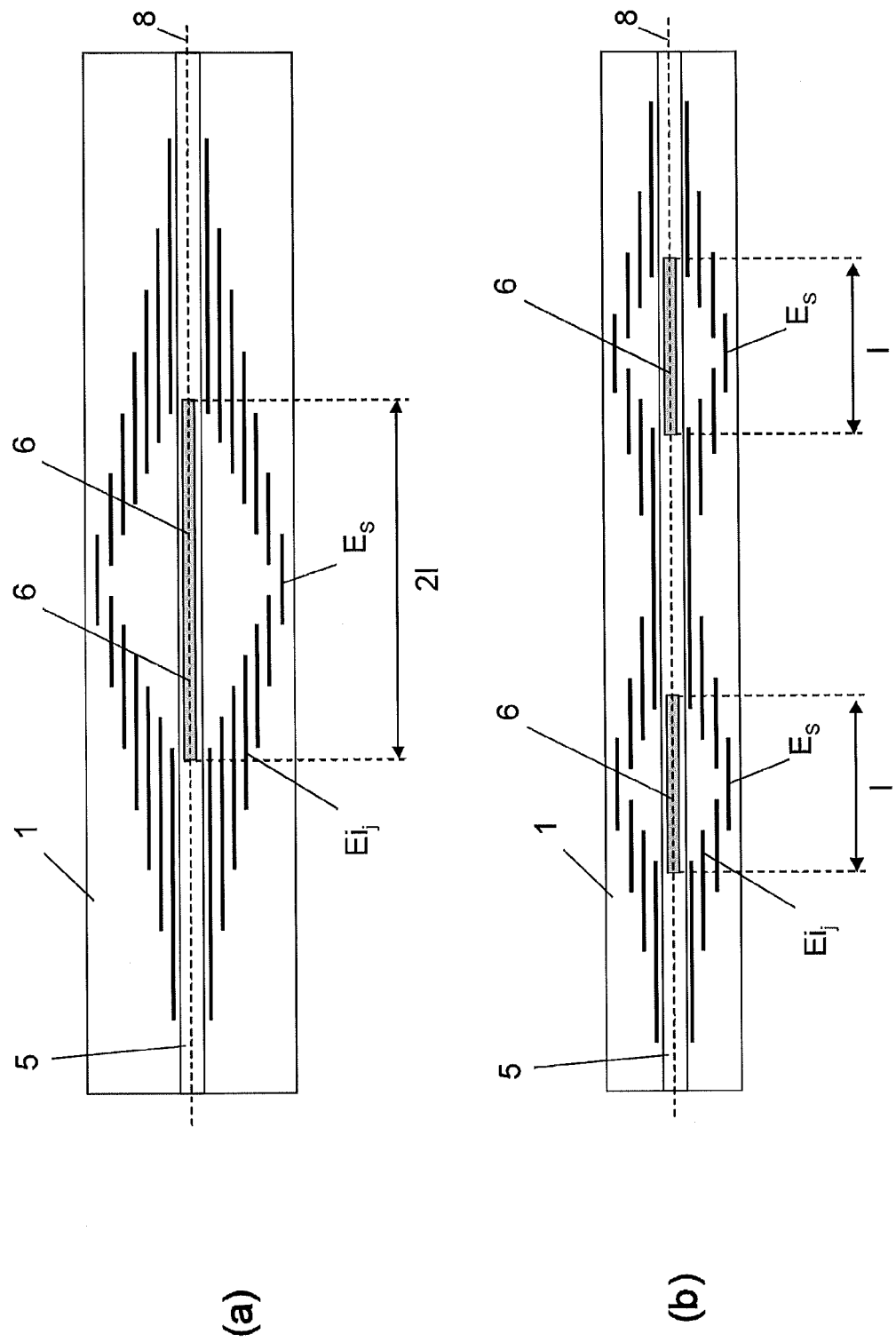
FIG. 9 shows alternative electrode assemblies for a given rated voltage: (a) voltage sensor with a single field sensor of length 21, (b) voltage sensor with two separate field sensors each of length 1, according to an exemplary embodiment of the present disclosure.

It should be noted that distributing the voltage on two separate crystals of length l results in a smaller insulator diameter and thus lower insulator cost than applying the same voltage to a single crystal of length 21 as illustrated in FIG. 9. A single long crystal (FIG. 9a) requires more electrode layers and thus a larger insulator diameter than two shorter crystals (FIG. 9b) in order to keep the field strength between the layers below critical limits.

At even higher operating voltages, a corresponding number of lower voltage modules is arranged in series, for example, four 125 kV modules for an operating voltage of 420 kV (FIG. 2c). To achieve sufficient mechanical strength of the structure, these serial modules may be mounted in a standard hollow core high-voltage outer insulator 25, which is, for example, made of fiber-reinforced epoxy. The hollow volume between the modules and the outer insulator 25 is filled with, for example, polyurethane foam, again, to provide sufficient dielectric strength and to some degree mechanically decouple the modules from the outer insulator 25. In an arrangement as in FIG. 2c, the individual insulating bodies 1 are not equipped with silicone sheds but the external or outer insulator 25 is equipped with sheds 19 instead.

Furthermore, the geometry of the field steering electrodes may be chosen somewhat differently for the individual modules for further optimization of the field distribution. Additionally, there may be corona rings at the ground and high-voltage ends of the structure as well as at intermediate positions.

In case of several modules it may be sufficient to equip only one module or a subset of modules with an electric field sensor in case the voltage ratios remain sufficiently stable.

Field Sensor Assembly

FIGS. 3a and 3b illustrate the assembly of field sensor 6 within bore 5 of insulator 1. The specific example is for an optical field sensor, even though similar techniques can, where applicable, also be used for other types of field sensors.

The main features are as follows:

The whole structure is pre-assembled as a sub-unit and then inserted into bore 5. The remaining hollow volume of bore 5 is subsequently filled with silicone gel as mentioned above. Instead of filling the whole of bore 5, the silicone filling may be restricted to the high-field region in the vicinity of field sensor 6.

Each field sensor 6, which may, for example, be formed by an electro-optical crystal, is mounted inside a support tube 22, which is, for example, made of fiber re-enforced epoxy, by means of soft braces 24 in the field free volume at the field sensor ends. Mechanical forces acting on the field sensor are thus kept at a minimum, for example, the field sensor is mechanically decoupled from the insulating rod.

For an optical sensor, the fibers 26 that guide the light to and from field sensor 6 have strain reliefs 28 that are part of support tube 22.

On both sides support tube 22 is connected via flexible joints 35 to spacer tubes 32. The spacer tubes 32 extend to the ends of the insulator 1 or, in case of a series of several field sensors 6 in a single insulator 1, may extend to the adjacent field sensor 6 (FIG. 3b). The flexible joints 35 accommodate for differential thermal expansion of insulator 1 and the various tube segments as well as for a bending of the whole structure, for example, due to wind forces. The spacer tubes 32 may be composed of several subsections, again with flexible joints in between them.

Figure 3:
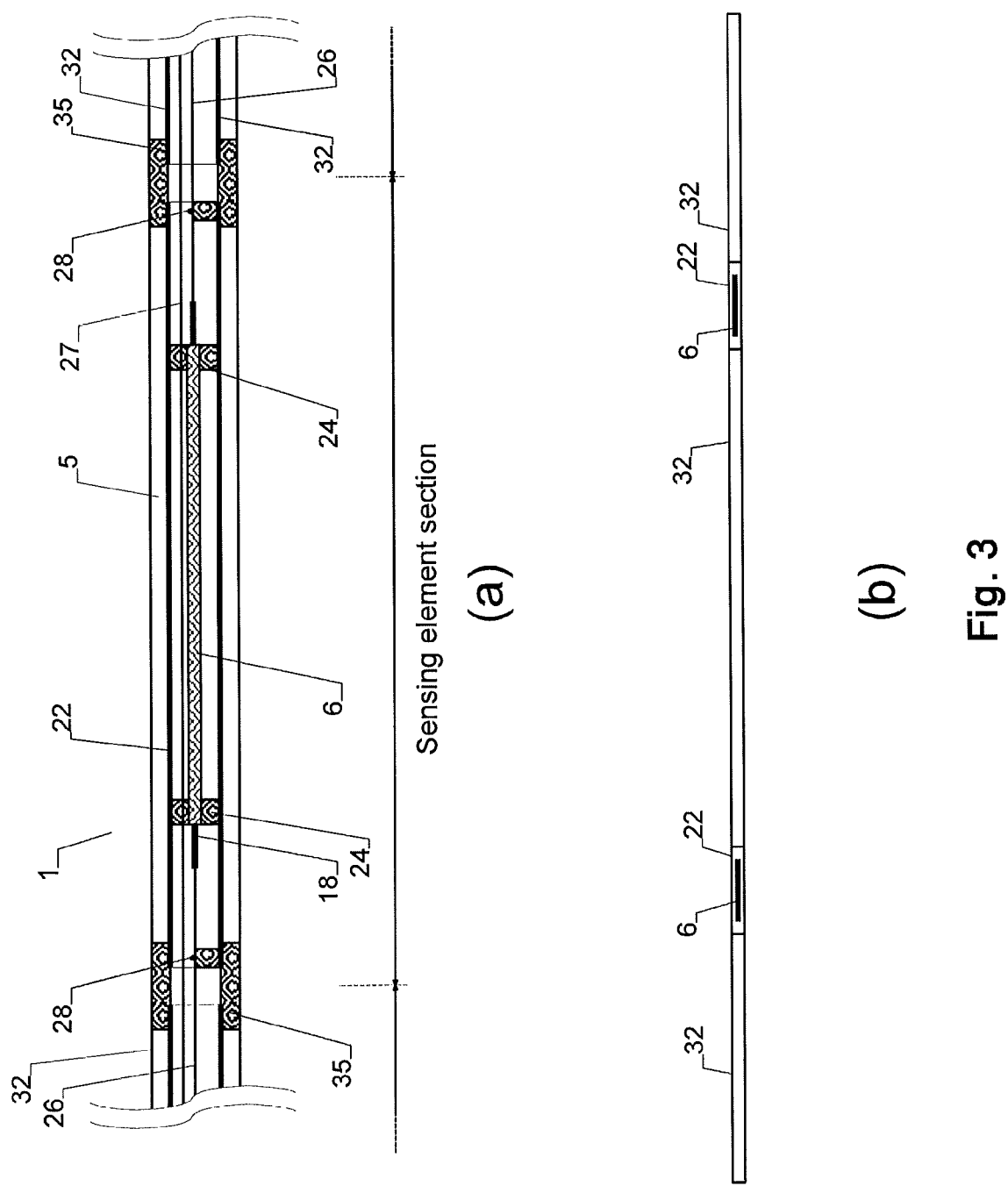
FIG. 3 shows (a) a sectional view of a field sensor within a voltage sensor and (b) the arrangement of two field sensors, according to an exemplary embodiment of the present disclosure.

If the field sensors 6 are operated in optical transmission as shown in FIG. 3, the return fiber 27 forms a semi-loop in an adequate hollow volume at the end of an individual insulator 1 or at the far end of the whole structure, if the insulator is composed of several individual bodies 1 as in FIG. 2b, 2c.

In accordance with an exemplary embodiment, the contact points 2, 3 of insulating insulator 1 are equipped with metal flanges. The flanges are in electric contact with metal contacts 4 (or contacts 4 may be included by such metal flanges). The flanges facilitate the mounting of the voltage sensor and, in case of a series of several voltage sensor modules, the connection of neighboring modules. The metal flanges may also provide the hollow volume for the above mentioned semi-loop of the return fibers.

Figure 8:
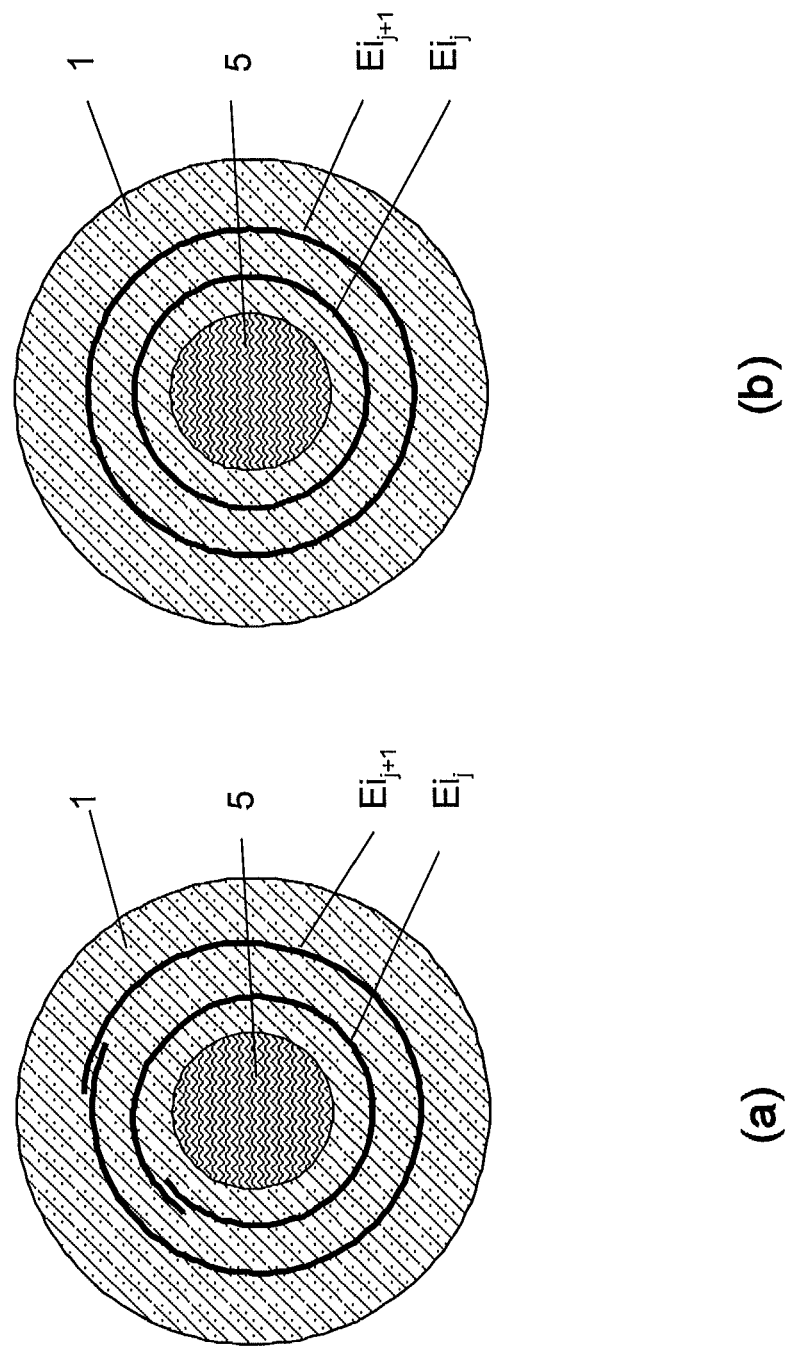
FIG. 8 shows, when seen in axial direction, (a) electrode layers with overlapping ends and (b) electrodes forming closed cylinders, according to an exemplary embodiment of the present disclosure.

It should be noted that the individual electrodes of the two sets E1$i$ and E2$i$ may not form perfect cylinders but for manufacturing reasons may be formed of an aluminum foil, the ends of which overlap as illustrated in FIG. 8a with a thin layer of insulating material between the overlapping ends. Alternatively the overlapping foil ends are in direct contact and thus form electrically closed cylinders, as indicated in FIG. 8b.

Sensor Modifications

Asymmetric Location of Sensing Cavity

In the above description, it has been assumed that the sensing cavity is located at mid distance between contact points 2, 3 of insulator 1. Depending on the particular environment of the voltage sensor, it may be conceivable that an asymmetric location of the sensing cavity with respect to contact points 2, 3 is more adequate. For example, in that case, the two sets of electrodes E1$i$ and E2$i$ are also asymmetric and reference plane 16 as well as shield electrode $E_s$ is moved from the center of the cavity towards the contact point at the far end of insulator 1. For example, if the sensor cavity is closer to contact point 2, reference plane 16 and shield electrode Es are shifted towards contact point 3. As a result axial distances B1$i$ are longer than axial distances B2$i$ and likewise axial distances C2$i$ are longer than axial distances C1$i$. The values within each set B1$i$ B2$i$ C1$i$ C2$i$ of axial distances may be chosen as equal or may be chosen differently in order to further optimize the field distribution depending on the particular situation. As an extreme case one set of electrodes E1$i$ or E2$i$ may be completely omitted.

Local Field Measurement

As the field distribution inside the sensing cavity is rather homogeneous and stable, a local (e.g., essentially point like) electric field measurement, for example, at the center of the cavity, can be an option as alternative to or even in combination with a line integration of the field. A local electric field sensor in this sense is a sensor that measured the electric field along only part of the axial extension of the sensing cavity. The local field essentially varies in proportion to the applied voltage. The influence of thermal effects on the local field strength, for example, due to the thermal expansion of sensing cavity 7, may be compensated in the signal processor, if the temperature is extracted as mentioned below.

As a further alternative to a perfect line integration of the electric field in sensing cavity 7 by means of a long crystal, the voltage may be approximated from several local (point like) field measurements, with the local field sensors arranged at several points within cavity 7 along axis 8. Particularly, such an arrangement can be of advantage, if the length of sensing cavity is chosen relatively long so that it is difficult to cover this length with a single crystal. Such an arrangement may be of interest in case rather high voltages (e.g. 420 kV or higher) are to be measured with a single voltage sensor module.

Still another alternative is to combine several crystals (with their electro-optic axes aligned) to form a longer continuous sensing section.

Furthermore, a combination of several electro-optic crystals with inactive material (such as fused silica) in between as described in [7] and interrogated by a single light beam may be employed.

Field Sensor with Contact Electrodes

To ascertain that the total voltage drops over the length of field sensor (6), it can be beneficial if the ends of sensor 6 are equipped with electrodes that are in electric contact with the innermost electrodes $E1_1$ and $E2_1$. The electrodes may be bulk metal parts, transparent electrode layers such as indium tin oxide, or a combination thereof.

Voltage Measurement in Gas-Insulated Switchgear

Ref. 15 describes an optical voltage sensor for SF6 gas-insulated switchgear. Here, a piezoelectric crystal with an attached fiber is used to measure the voltage between two electrodes at the crystal ends. Other alternatives are an electro-optic crystal or any other kind of optical voltage sensor. The electrodes have considerably larger radial dimensions than the crystal in order to provide a reasonably homogeneous electric field distribution along the crystal.

A capacitively coupled electrode arrangement as shown in FIG. 1 may also be used for voltage sensors in gas insulated switchgear in order to avoid the large size electrodes of [15]. In this case, the two sets of electrodes E1i and E2i may again be embedded in an insulating rod as shown in FIG. 1. Alternatively, a solid insulation material may be omitted and be replaced by the insulating SF6 gas of the switchgear system. In the latter case the sets of electrodes may be kept in place by means of insulating spacer parts between the various electrode layers.

Instead of SF6 gas another insulating gas such as nitrogen may be used. A further alternative is vacuum.

In other conceivable applications of the sensor, for example in electric power transformers, a liquid, commonly transformer oil, may be used as the insulating material.

In other words, insulator 1 can also be or include a liquid, gas or vacuum, in addition to a solid or any combinations thereof.

Optical Sensor Elements

As mentioned, field sensor 6 is, in accordance with an exemplary embodiment, an electro-optical field sensor, or, in more general terms, an optical sensor introducing a field-dependent phase shift between a first polarisation or mode and a second polarization or mode of light passing through it.

In accordance with an exemplary embodiment, such an optical sensor includes an electro-optical device with field-dependent birefringence, in particular a crystal or a poled waveguide, such as a poled fiber, exhibiting a Pockels effect, or a piezo-electric device, in particular of crystalline quartz or a piezoelectric ceramic, and an optical waveguide carrying at least two modes, wherein the waveguide is connected to the piezo-electric device in such a manner that the length of the waveguide is field-dependent.

In accordance with an exemplary embodiment, a voltage sensor measures the path integral of the electric field between two electric potentials, for example, ground and high voltage potential. This concept is particularly suited for outdoor installations, because the measurement accuracy is not deteriorated by field perturbations, for example, due to rain or ice or by cross-talk from neighboring phases. Electro-optic crystals of certain symmetry are well suited to implement this concept [3].

Pockels Effect

An electric field applied to an electro-optical crystal induces an anisotropic change in the refractive index of the material (birefringence). This birefringence causes a phase shift between two orthogonally linear polarized light waves traversing the crystal (Pockels effect). By measuring this phase shift the applied voltage can be inferred.

Figure 4:
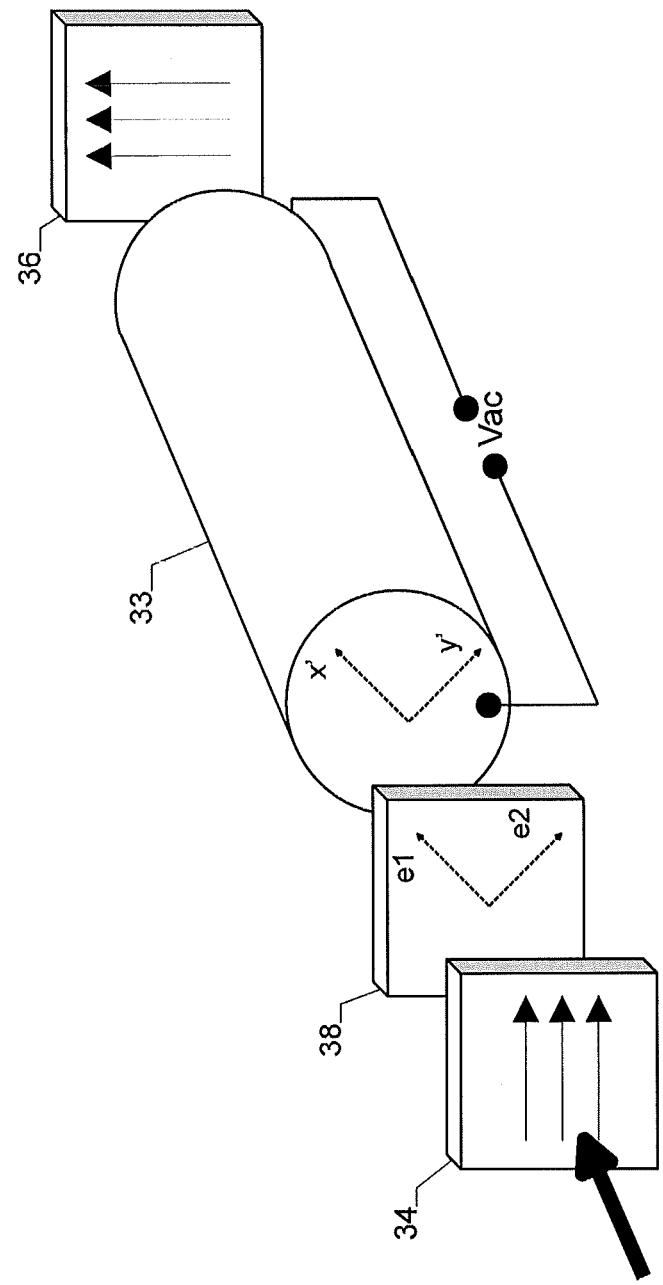
FIG. 4 shows an optical field sensor and the alignment of the axes of the electro-optic crystal, the retarder, and the polarizers, according to an exemplary embodiment of the present disclosure.

An exemplary configuration of a field sensor 6 which implements line integration of the electric field is shown in FIG. 4: The voltage is applied to the end faces of a crystal 33 with the light also entering and leaving the crystal through the end faces. The crystal material and its axis orientation have to be chosen such that only electric field components $E_z$ (pointing along the cylinder axis z or 8) contribute to the electro-optic phase shift [1, 3]. One suitable material is $Bi_4Ge_3O_{12}$ (BGO) in a [001] configuration, corresponding to the 4-fold crystal axis being parallel to the direction of light propagation.

The input light (heavy arrow) is linearly polarized by a first polarizer 34 (arrows indicate direction of transmitted polarization; the polarizer may be an in-fiber polarizer as well). To achieve maximum modulation contrast, the electro-optic axes of the crystal x', y' can be, according to an exemplary embodiment, oriented under an angle of 45° with respect to the incoming linear polarized light. The phase shift Γ caused by the electric field is converted to an amplitude modulation of the light by a second polarizer 36 placed at the output end of the crystal. To bias the phase retardation, a retarder 38 may be placed into the beam path (between the two polarizers 34, 36), which adds an additional phase shift φ. The principal retarder axes, e1 and e2, are aligned parallel to the electro-optic axes, x' and y'.

In general the intensity I of the transmitted light is given by $I = I_0 \sin^2([\Gamma + \phi]/2)$. In the case of a λ/4-waveplate used as retarder 38 this becomes $$I = I_0 \sin^2\left(\frac{\pi}{2}\frac{V}{V_\pi} + \frac{\pi}{4}\right)$$

with the half-wave voltage $$V_\pi = \frac{\lambda_0}{2n_0^3 r}$$

For $abs(V) \ll V\pi/2$ the intensity then changes linearly with the voltage. Here V is the voltage applied to the crystal, λ is the wavelength of the light, $n_0$ is the refractive index of the crystal, and r is the relevant Pockels coefficient. For BGO Vπ is about 75 kV at a wavelength of 1310 nm.

Generation of Quadrature Signals

Figure 10:
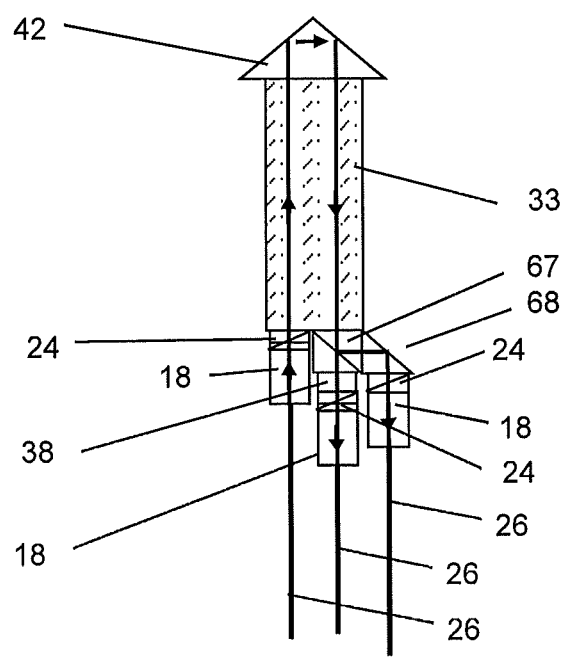
FIG. 10 shows an optical field sensor operated in reflection with optics for generation of two signals at quadrature from a single sensing element, according to an exemplary embodiment of the present disclosure.

For typical voltages at high-voltage substations, the voltage V is much larger than the half-wave voltage Vπ, which results in an ambiguous sensor response. This ambiguity may be removed by working with two optical output channels that are substantially 90° (π/2) out of phase (in quadrature) [11], or that have any other mutual phase shift that is not a multiple of π. The 90°-phase shift may be generated by splitting the light leaving the crystal into two paths by means of a beam splitter 67 and a deflection prism 68 and putting a quarter-wave plate 38 into one of the paths (FIG. 10) [3]. Further modifications are illustrated in [3]. FIG. 10 shows an arrangement where the sensor is operated in a reflective mode. Alternatively, the sensor may be operated in transmission, for example, the optics for the generation of the quadrature signals is then arranged at the opposite crystal face so that the light passes the crystal only once.

Another option to remove the ambiguity is to operate the sensor with light of two different wavelengths [12].

In the sensor according to the present disclosure containing two or more crystals, such as in the assembly of FIG. 2b, 2c or 3, a quadrature signal may also be generated by inserting a phase retarder 38 into the optical path at one of the crystals and operating the other crystals without a retarder, for example, there is only one output channel per crystal (FIG. 4). Extra beam splitters and deflection prisms for a second channel as needed in [3] are thus avoided. As a result the device becomes significantly smaller, which allows to mount the sensing elements in a relatively narrow bore.

In accordance with an exemplary embodiment, the assembly is designed such that the voltage drops at each sensing element are the same. The signals from the individual crystals have then, as a function of the overall voltage, the same periodicity. In cases where the relative voltage drops at the various sensing elements may substantially vary due to environment perturbations of the electric field distribution, it may be of advantage with regard to the signal processing to generate two signals at quadrature from each individual sensor element (arrangement of FIG. 10). The periodicity of the two signals and their phase difference then remains constant (apart from the temperature dependence of the retarder) and is not affected by the field distribution.

Alternatively, the assembly may be designed such that the voltage drops over the different crystals differ. In this case in optical signals from the individual crystals have different periodicity. With appropriate signal processing this also allows to unambiguously reconstruct the applied voltage.

Figure 5:
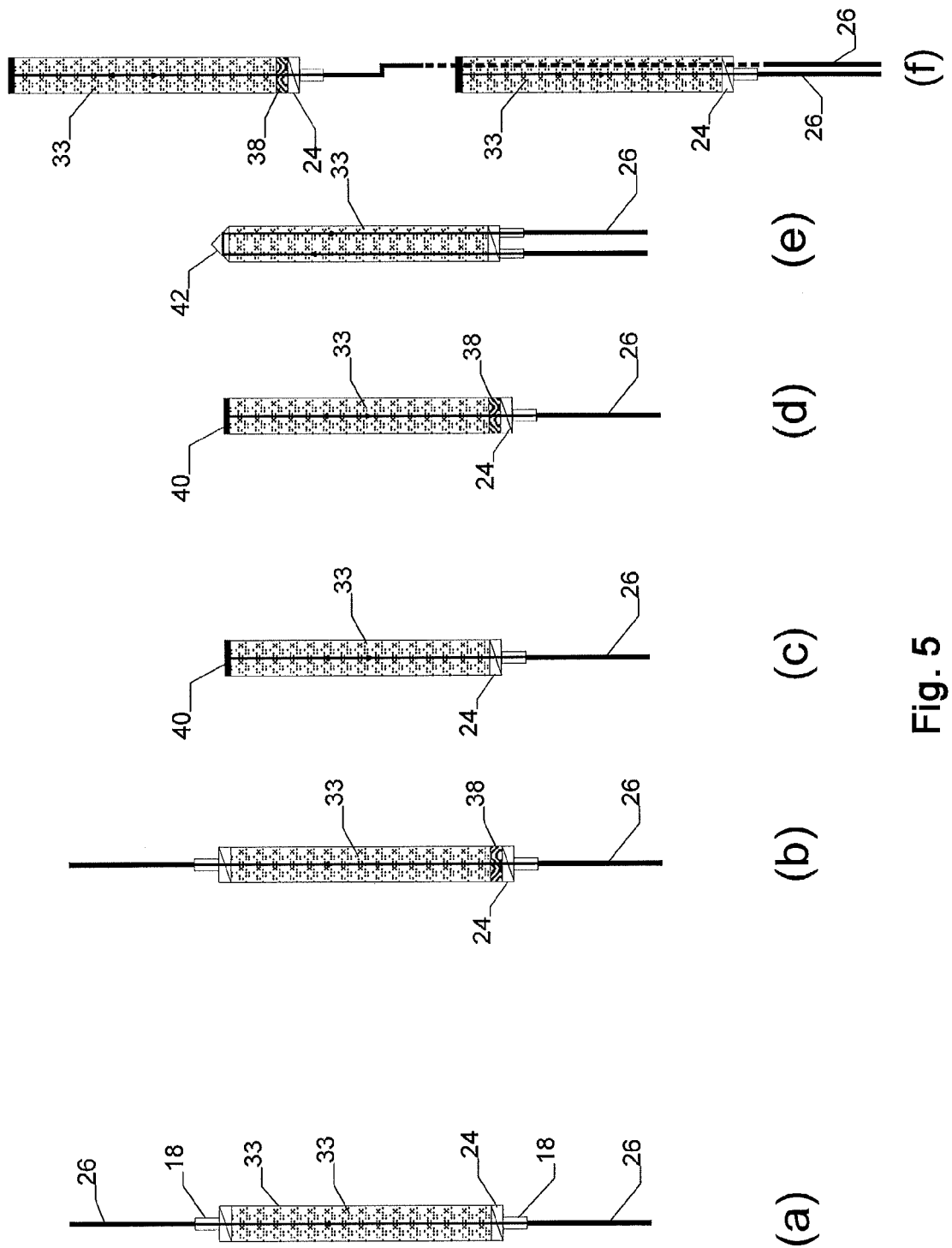
FIG. 5 shows (a) an optical field sensor with polarizers operated in transmission, (b) an optical field sensor with retarder and polarizers operated in transmission, (c) an optical field sensor with polarizer operated in reflection, (d) an optical field sensor with retarder and polarizer operated in reflection, (e) an optical field sensor with reflective prism, and (f) a series arrangement of two optical field sensors, according to an exemplary embodiment of the present disclosure.

FIG. 5 shows the optical components in more detail. The components (polarizers, waveplate, fiber pigtailed collimators) can be, in accordance with an exemplary embodiment, directly attached to the crystal, for example, by an optical adhesive. The assembly of FIG. 5a is without a retarder while the assembly of FIG. 5b is with a retarder 38, in particular a quarterwave retarder, to generate a quadrature signal.

In FIG. 5a, 5b the crystals are operated in transmission. Alternatively only one fiber 26 may be used to guide the light to and from the crystal 33 as shown in FIG. 5c, 5d. In this case a reflector 40 at the other end of the crystal is used to direct the light back into the fiber. This configuration doubles the sensitivity of the sensing element. As a result of the double pass, a $\pi/8$ retarder 38 is now used to generate a quadrature signal.

A reflective configuration may also be realized with two individual fibers 36 for light input and output light and a prism reflector 42 as shown in FIG. 5e.

Turning back to the configuration where an assembly including several field sensors is used, it has been mentioned that a retarder 38, for example, a $\lambda/4$ retarder, can be attributed to one of them, or, more generally, only to a subset (e.g., not all) of them, for adding an additional phase retardation to the light passing through the respective field sensor(s), which can then be used for quadrature demodulation. This is schematically depicted in FIG. 5(f).

Alternatively (or in addition) to adding one or more retarder(s) to such an assembly, it is possible to dimension at least one (or a subset) of the field sensors such that it generates an electro-optic phase shift that is substantially different from the phase shifts of the remaining field sensors, in particular of $\pm\pi/2$ or less at the maximum voltage to be measured. The respective field sensor(s) may, for example, be shorter than the other field sensor(s). In that case, the signal of the respective field sensor(s) is unambiguous, which allows to correct for ambiguities in the (more accurate) signals of the other field sensor(s).

Sensor Interrogation

The light is guided to and from the individual crystals by means of single or multimode optical fibers [3]. The fibers may be embedded in the silicone filling inside bore 5 of the epoxy rods. The crystals may be operated in transmission or in reflection [3], as illustrated in FIG. 5 and FIG. 10.

Figure 6:
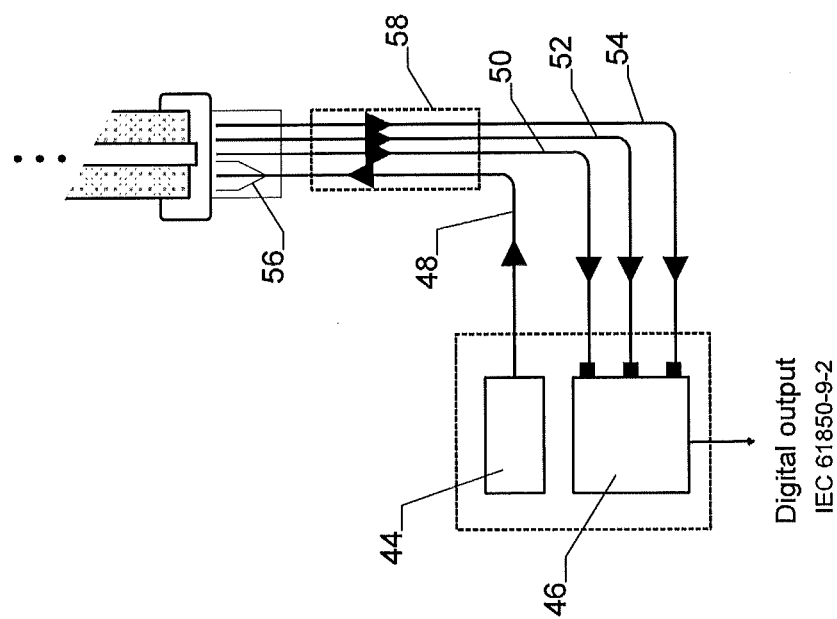
FIG. 6 shows the source and signal processing module and its optical connections to a series of optical field sensors according to an exemplary embodiment of the present disclosure.

In an arrangement including several voltage sensors in series, the field sensors 6 may be interrogated using a common light source 44 and signal processing unit 46 as shown in FIG. 6. In accordance with an exemplary embodiment, the light from light source 44 is transmitted by a single fiber link 48 to the base of the sensor (this sensor end is at ground potential). Then the light is distributed to the individual field sensors 6 by a means of a fiber-optic beam splitter 56. The light is returned from each field sensor 6 to signal processor unit 46 by individual fiber links 50, 52, 54. All fibers (input and output) may be embedded in a common fiber cable 58.

In accordance with an exemplary embodiment, the optoelectronics module may be mounted directly at the base of the sensor to avoid long fiber cables. Additionally, the opto-electronics module may be equipped with means for active or passive temperature control.

Temperature Compensation

The phase shift introduced by retarder 38 is generally a function of temperature. Therefore, the temperature at the location of the retarder can be extracted in the signal processor from two of the above mentioned quadrature signals, as is also mentioned in [3]. The temperature information can then be used to compensate for any temperature dependence of the voltage measurement. Commonly, the retarder temperature can be considered as a sufficiently good approximation of the overall temperature of the voltage sensor. The temperature dependence of the voltage measurement may be composed of several contributions: the temperature dependence of the electro-optic effect and additionally, in case of local field sensors, contributions from the temperature dependence of the dielectric constants of the sensor material and surrounding materials as well from changes in the local electric field strength due to the thermal expansion of the insulator 1 with embedded electrodes.

In the following further examples and embodiments are discussed, in particular in connection with FIG. 11-13.

Optimization of electric field distribution and voltage drop across sensor modules. In FIG. 11, an exemplary configuration of an assembly of high-voltage sensors is shown which includes a serial arrangement of at least two high-voltage sensors with identical electrode dimensions. The first primary electrode $E1_1$ of the second high-voltage sensor is connected to high potential and the second primary electrode $E2_2$ of the first high-voltage sensor connected to the ground potential (not shown). The second primary electrode $E2_1$ of the second high-voltage sensor is connected to the first primary electrode $E1_2$ of the first high-voltage sensor, such that the two electrodes are at the same potential. The electric field boundary conditions found in a typical substation environment, for example including neighboring phases, result in an unequal distribution of the voltages between the two high-voltage sensors. Similarly, the voltages are unequally distributed between the sets of electrodes arranged in the first regions 100, 101 with respect to the second regions 110, 111 in either one of the high-voltage sensors forming the assembly. This unequal distribution of the voltage generates enhanced electric field stress at certain locations of the high-voltage sensors, in particular in the bottom section 101 of the second high-voltage sensor. To compensate for this effect, the capacitances of the sets of electrodes in the first regions 100, 101 and the second regions 110, 111 of each high-voltage sensor can be made different, thus making the design of the high-voltage sensor asymmetric with respect to the measurement cavities 70 and 71, respectively. A useful way is to choose the axial length of the electrodes in the first regions 100, 101 to be longer than the electrodes in the second regions 110, 111. In exemplary configurations the capacitances $C_1$, $C_2$ and $C_3$, $C_4$ of the sets of the electrodes in the first and second regions 100, 110 and 101, 111, respectively, of the two high-voltage sensors can be chosen such that $C_1=C_3$ and $C_2=C_4$, and in particular with a ratio of $C_1/C_2$ being in the range of 1.1 to 1.5.

In accordance with an exemplary embodiment, the radial dimensions of the electrodes in the first 100 and second region 110 of the first high-voltage sensor and in the first 101 and second region 111 of the second high-voltage sensor are the same.

Alternative ways to optimize the capacitance of the field steering structure are:

Variation of the grading distance, for example, $B1_i \neq B2_i$ or $C1_i \neq C2_i$ (refer to FIG. 1).

Different number of electrodes in the first and second region 10, 11; 100, 101; 110, 111 of the high-voltage sensor or assembly of high-voltage sensors.

Different radial spacings, for example, distance P between electrodes being different in the first and second region 10, 11; 100, 101; 110, 111 of the high-voltage sensor or assembly of high-voltage sensors.

Connecting selected neighboring electrodes electrically to effectively short-circuiting them.

Changing the dielectric constant of the material between the electrodes; in particular, materials with high dielectric constant could be used to increase the capacitances and hence reduce the effect of unequal voltage distribution.

In general, it would be beneficial to choose the capacitance for the high-voltage sensors to be much larger in comparison to any stray capacitance. This will decouple the field distribution inside the sensing cavity from outside influences. For example, a material between the electrodes with high dielectric constant could be used to increase the capacitance and hence reduce the effect of unequal voltage distribution.

Alternatively or in addition, the shape of the metal contacts 4 connected to the electrodes can be chosen such that the effect of the stray capacitances on the voltage distribution is minimized. For example, the metal contact connected to the first primary electrode of the second high-voltage sensor could be designed with its diameter significantly larger than the diameters of all electrodes of that high-voltage sensor. In this way it would serve two functions: In addition to its mechanical purpose, in particular mounting fixture and sealing the top, it could be used for adjusting the stray capacitance.

Electrodes Attached to Sensor Crystal

An exemplary embodiment of the field sensor is an electro-optic crystal which is equipped with electrically conducting electrodes at both of its ends. Embodiments of such contacting electrodes 64 are shown in FIG. 12, wherein 640 designates a front part of the contacting electrode, 641 a flexible connection, 642 a front cavity of the contacting electrode, 643 a back part of the contacting electrode, 644 a sealing of the contacting electrode, 645 a back volume or internal volume of the contacting electrode, 648 centering pin(s), and 480 optical fibers or optical cables.

In embodiments these contacting electrodes 64 can have the following features (each feature alone or in any combination with other features):

The electrode is connected to the respective electric potential, for example, to the innermost electrodes (electrode $E1_1$ or $E2_1$) by means of an electrical connection 66, for example, a metal wire 66 running back to metal contact 4;

The connection between sensor crystal 33 and contacting electrode 64 is done in a flexible manner to avoid mechanical stress on the crystal 33, for example due to different thermal expansion of crystal 33 and electrode 64. Suitable materials are for example rubber o-rings or silicone; as an alternative the electrode 64 itself or its front part 640 could be fabricated from an elastic material, for example, electrically conductive rubber or other elastomer;

The front part 640 of the contacting electrode 64 can have a rounded shape which minimizes the electric field stress at the surface of the contacting electrode 64. The axial distance between the front part 640 of the electrode 64 and the front surface of the flexible connection 641 of the crystal 33 to the contacting electrode 64 is chosen sufficiently large so that electrical discharges in any of the materials and in particular at any material interfaces neighbouring the flexible connection 641 are avoided;

Exemplary materials for the contacting electrode 64 include electrically conducting materials, for example, metals and alloys like aluminum alloys and stainless steels. According to an exemplary embodiment, complex shaped electrodes 64 would be fabricated in a molding process in order to achieve low cost; for example, polymeric materials and polymer-based composites can be used for molding, such as electrically conductive thermoplastic or thermoset materials.

Figure 12:
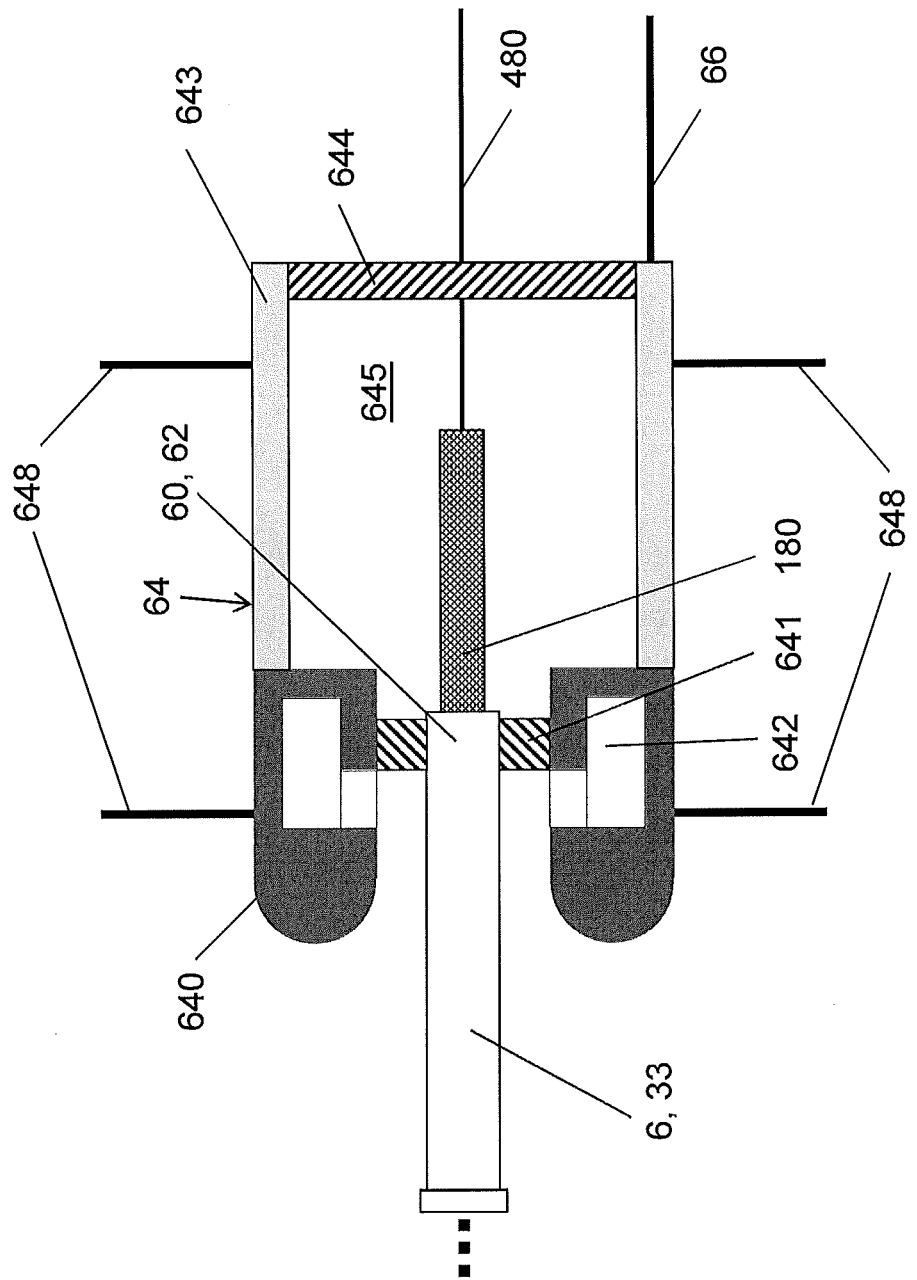
FIG. 12 shows a detailed cross-sectional view of a mounting and contacting electrode for a sensor body according to an exemplary embodiment of the present disclosure.
Figure 13:
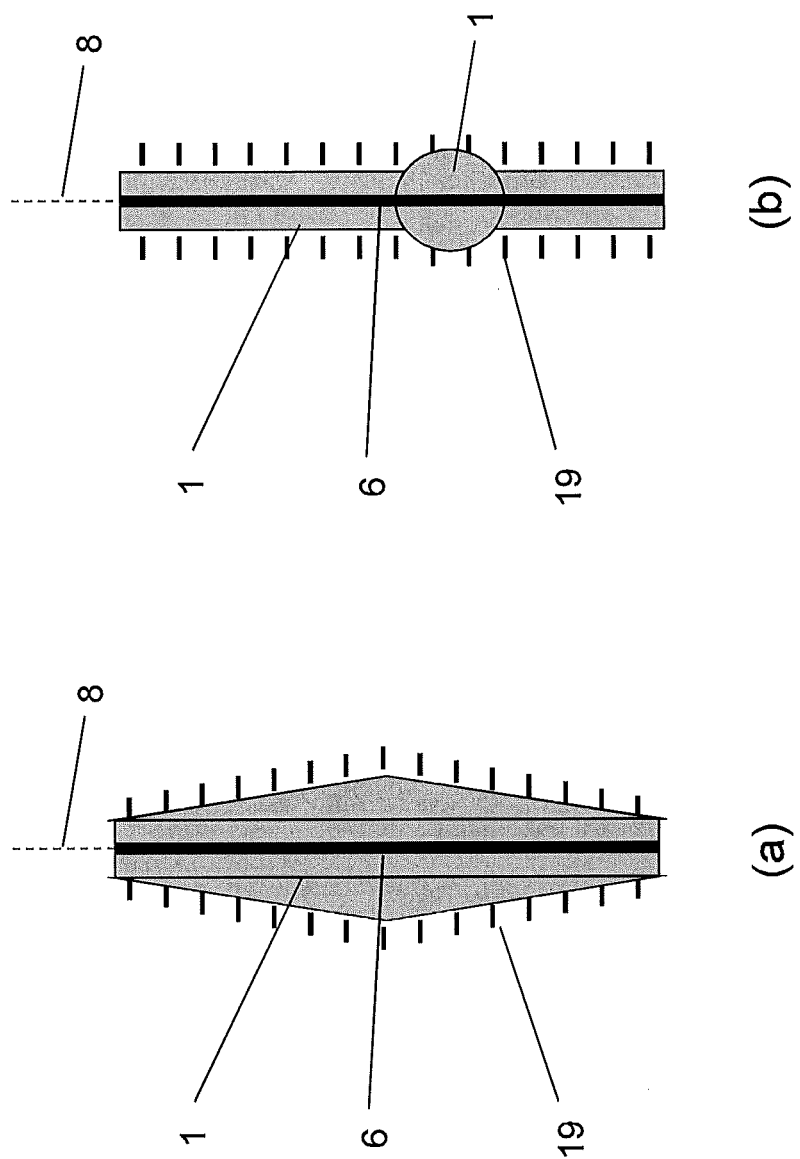
FIG. 13 shows high-voltage sensors having insulators of varying radial thickness according to an exemplary embodiment of the present disclosure.

The electrode may have a front cavity 642, as depicted in FIG. 12, in order to allow the filler material, for example, compressible silicone or polyurethane foam, to properly fill any space containing high electric fields, for example in the gap between contacting electrode 64 or front part 640 and sensor crystal 33; with the filler material being inserted at an overpressure, the remaining air will be compressed into the field free space inside this front cavity 642 which is free from electric fields and thus free from risk of electric discharges in air pockets formed during the filling process;

The contacting electrode 64 may be equipped with centering pins 648 protruding from it radially to position the sensor crystal 33 in the center of the bore 5;

The sealed contacting electrode 64, in particular its back part 643, is used to protect the optics assembly 180 from exposure to the filler material, such as silicone elastomer, for example. Additionally, the internal volume 645 of the contacting electrode 64 may be filled with special material for protection of the optics assembly 180, for example, like dry $N_2$ gas.

Fiber Handling and Return Fiber

FIG. 3(a) shows one possibility for handling of the return fiber 27, wherein the return fiber 27 is running through the sensing cavity 7 in the central bore 5 right next to the sensor element 6. In this configuration the return fiber 27 will be embedded in the filler material to guarantee sufficient dielectric strength.

Alternative exemplary embodiments for mounting the return fiber 27 are:

As shown in FIG. 2(c), at least one sensor module 1 may be placed inside a hollow-core insulator 25 composed of a fiber reinforced epoxy tube and having an external shed insulator 19, for example, made of silicone elastomer, on the outside of the tube. The gap between the insulator 1 and the hollow-core insulator 25 may be filled, for example, with polyurethane foam. Because the field strength in this gap is much smaller than the field strength in the sensing cavity 7, it would be beneficial to mount the return fiber 27 inside this gap.

Alternatively, the external silicone sheds 19 could be directly molded onto the outside of the insulator 1. The return fiber 27 could be mounted in a helical-shaped groove at the outside of the insulator 1. Here the fiber 27 can be overmolded by the silicone sheds 19.

Alternatively, the return fiber 27 could be embedded into a resin impregnated paper (RIP) body of the insulator 1 during winding.

Figure 11:
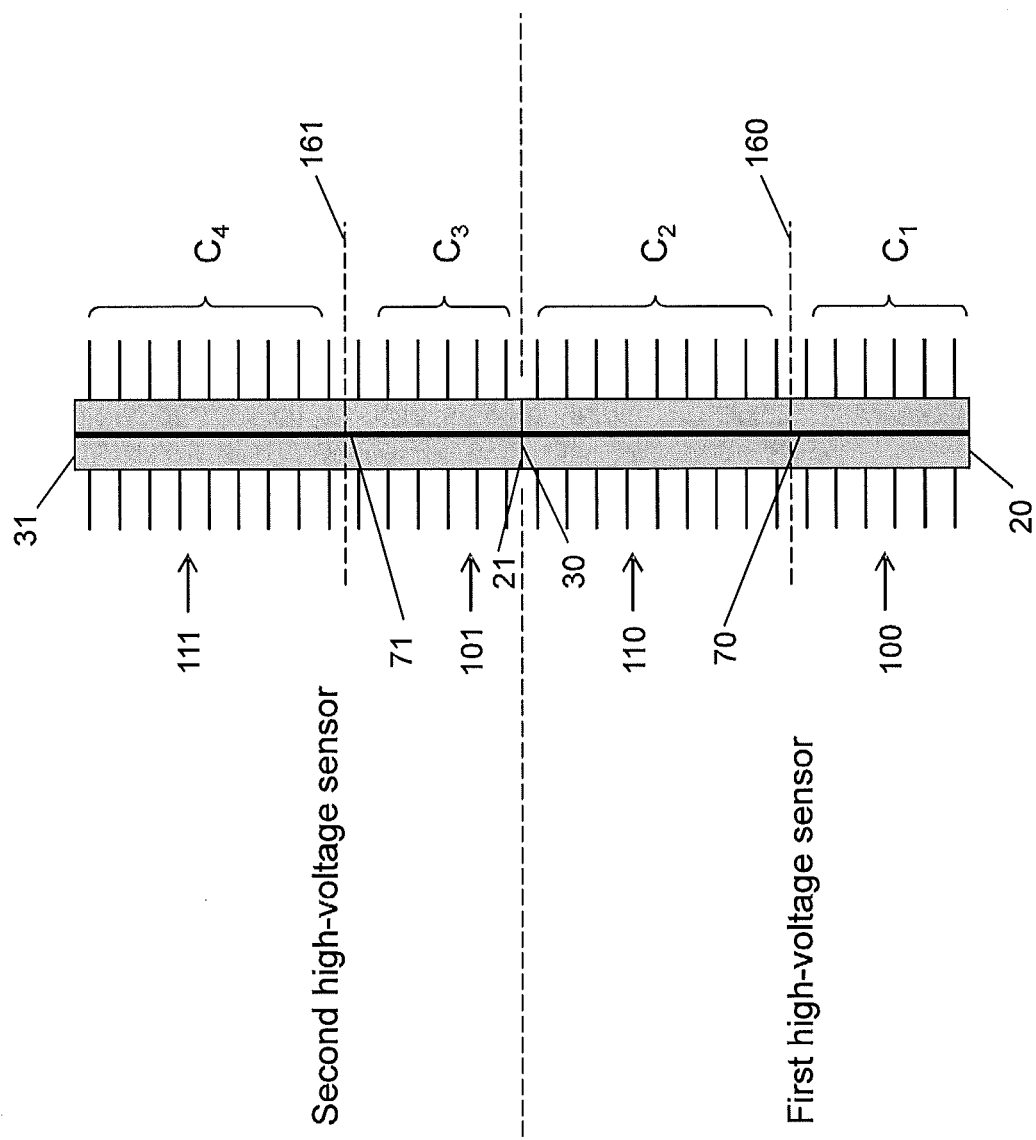
FIG. 11 shows an assembly of two field sensors arranged in series according to an exemplary embodiment of the present disclosure.

These ways to mount an optical fiber are not limited to the return fiber 27 only. There may be additional optical fibers mounted in the sensor module:

For serial installation of several modules, for example, two modules as shown in FIG. 11, one or more fibers, for example, 26 in FIG. 3(a), passing through the bottom module(s) can be provided to optically connect the module(s) further up. In accordance with an exemplary embodiment, the interconnection of optical fibers in adjacent modules would be done by means of optical splices. The optical splices can be placed inside a hollow volume in the structure, for example, a flange, used for making the mechanical connection between the modules. Alternatively or in addition, the mechanical connection could be equipped with a lateral opening which would allow access to the fibers and optical splicing after mechanically connecting the modules.

Optical fibers might be needed to make connection to other types of sensors mounted on the top of the voltage sensor, for example, like an optical current sensor.

Various fiber types could be used at different locations, for example, the optical fibers could be single-mode fibers, multi-mode fibers, or polarization maintaining fibers.

Manufacturing of the High-Voltage Sensor

In its simplest form, the high-voltage sensor has a cylindrical shape with a constant outer diameter along its entire length, as shown in FIG. 2(a). In order to save material and reduce cost it is beneficial to optimize the outside shape. In embodiments, the diameter of the high-voltage sensor can be bigger at locations of high electric field strength, whereas a smaller diameter can be used at locations where the field strength is low. Possible configurations are shown in FIG. 13. In accordance with an exemplary design in FIG. 13(b), the diameter of the high-voltage sensor is increased around the end position of the shield electrode $E_s$ (not shown) facing the bottom end of the high-voltage sensor where the axial electric field strengths on the insulator surface is the highest. Alternatively, a locally increased diameter can be positioned at several different points of the sensors length.

Notes

When using electro-optical crystals as field sensors, several (or all) crystals may be interrogated by one light beam which traverses the crystals one after the other. This could for example be achieved by either shining a free space beam through all crystals (with the crystal axes properly aligned) or by interconnecting adjacent crystals with a polarization-maintaining fiber. The birefringent fiber axes are then aligned parallel to the electro-optic axes of the crystals.

Instead of bulk electro-optic crystals, electro-optic waveguide structures may be used [13].

The voltage sensor can also be used with other types of field sensors, such as piezo-optical sensors based on quartz crystals [6] or sensors based on poled waveguides, such as poled fibers [14].

As mentioned, the electrodes can be metal foils embedded within insulating insulator 1 with longitudinal dimensions selected such that a voltage applied to the ends of insulator 1 homogeneously drops over the length of the field sensor inside the sensing cavity 7 and over the full length of insulator 1 at its outer surface. Excessive peak electric fields are avoided.

Figure 7:
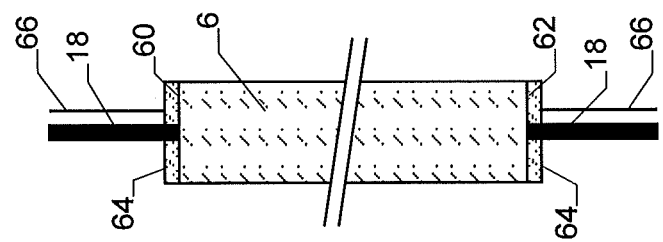
FIG. 7 shows a field sensor with end electrodes or contacting electrodes according to an exemplary embodiment of the present disclosure.

Optionally, and as schematically depicted in FIG. 7, the first and second ends 60, 62 of field sensor 6 can be electrically contacted to the first and second contact points 2, 3, respectively, for example, by means of metal electrodes 64 or optically transparent conductive coatings (such as indium tin oxide layers) at the ends 60, 62 and wires 66 leading through bore 5. This design further improves measurement accuracy because it ensures that the ends 60, 62 of field sensor 6 are at the potentials of the two contact points 2, 3, respectively.

In general terms and in accordance with an exemplary embodiment, the voltage sensor includes an insulator 1 with mutually insulated electrodes Eij, $E_s$ embedded therein. The electrodes are coaxial and cylindrical and overlap axially over part of their lengths. They are mutually staggered and guide the homogeneous field outside the sensor to a substantially homogeneous but higher field within the sensing cavity 7 within the insulator 1. A field sensor 6 is arranged within the sensing cavity 7 to measure the field. This design allows to produce compact voltage sensors for high voltage applications.

All appended claims 1 to 36 are herewith literally and in their entirety incorporated into the patent description by way of reference.

Thus, it will be appreciated by those skilled in the art that the present disclosure can be embodied in other specific forms without departing from the spirit or essential characteristics thereof. The presently disclosed embodiments are therefore considered in all respects to be illustrative and not restricted. The scope of the disclosure is indicated by the appended claims rather than the foregoing description and all changes that come within the meaning and range and equivalence thereof are intended to be embraced therein.

REFERENCES

1. L. Duvillaret, S. Rialland, and J.-L. Coutaz "Electro-optic sensors for electric field measurements. II. Choice of the crystal and complete optimization of their orientation" J. Opt. Soc. Am. B 19 2704 (2002)
2. U.S. Pat. No. 4,904,931
3. U.S. Pat. No. 5,715,058
4. U.S. Pat. No. 6,252,388
5. U.S. Pat. No. 6,380,725
6. U.S. Pat. No. 6,140,810
7. U.S. Pat. No. 6,876,188
8. U.S. Pat. No. 3,875,327
9. U.S. Pat. No. 4,362,897
10. EP 1 939 897 A1
11. U.S. Pat. No. 5,001,419
12. WO 98/05975
13. U.S. Pat. No. 5,029,273 and N. A. F. Jaeger et al., IEEE Trans. Power Deliv. 10 127 (1995)
14. U.S. Pat. No. 5,936,395 and U.S. Pat. No. 6,348,786
15. EP 0 789 245 A2
16. K. Bohnert et al., Optical Engineering, 39 (11), 3060 (2000).
17. Standard of the International Electrotechnical Commission IEC60044-7, Instrument transformer—Part 7: Electronic voltage transformers.

REFERENCE NUMBERS

1: insulator
2, 3; 20, 30; 21, 31: contact points
4: metal contacts
5: bore
6: field sensor
7; 70, 71: sensing cavity
8: longitudinal axis
10, 11; 100, 110; 101, 111: first and second region
14: central end of electrode
15: contact end of electrode
16, 160, 161: reference plane
18, 180: collimator, optics assembly
19: sheds
25: hollow core high-voltage insulator, outer insulator, external insulator
22: support tube
24: braces
26: fibers 27: return fiber
28: strain reliefs
35: joints
32: spacer tubes
33: crystal, sensing element
340: optics, optics assembly
34, 36: polarizers
38: retarder
40: reflector
42: prism reflector
44: light source
46: signal processing unit
480: optical fiber cable(s)
48, 50, 52, 54: fiber link
56: beam splitter
58: fiber cable
60, 62: ends of field sensor
64: metal electrodes, conductive coatings, contacting electrode
640: front part of contacting electrode
641: flexible connection
642: front cavity of contacting electrode
643: back part of contacting electrode
644: sealing of contacting electrode
645: back volume of contacting electrode, internal volume of contacting electrode
648: centering pin(s)
66: wires
67: beam-splitter
68: deflection prism
a, Bij, Cij: axial distances
$C_1, C_2, C_3, C_4$: capacitances
P: radial distances
Eij, Es: electrodes
L: length of insulator
l: length of crystal
D: diameter of insulator
d: diameter of crystal
e: diameter of bore

What is claimed is:

1. A high-voltage sensor for measuring a voltage between a first contact point and a second contact point, the high-voltage sensor comprising
an insulator comprising an insulating material extending along an axial direction between the first and the second contact points, the insulator including at least one sensing cavity;
a plurality of conductive electrodes arranged in the insulator, the conductive electrodes being mutually separated by the insulating material and capacitively coupled to each other; and
at least one electric field sensor arranged in the at least one sensing cavity of the insulator, wherein:
for at least part of the conductive electrodes, each conductive electrode axially overlaps at least one other one of the electrodes;
the conductive electrodes are configured to steer an electric field in the sensing cavity so that the electric field has a mean field strength larger than the voltage between the first and second contact points divided by a distance between the first contact point and the second contact point; and
for each sensing cavity, the conductive electrodes include a first set of electrodes in a first region of the insulator that extends from a reference plane of the sensing cavity to the first contact point and a second set of electrodes in a second region of the insulator that extends from the reference plane of the sensing cavity to the second contact point, the reference plane extending radially through the sensing cavity.

2. The high-voltage sensor of claim 1, wherein at least one of the conductive electrodes is a shield electrode radially surrounding the at least one sensing cavity.

3. The high-voltage sensor of claim 1, comprising:
a first primary electrode electrically connected to the first contact point; and
a second primary electrode electrically connected to the second contact point,
wherein the conductive electrodes form a capacitive voltage divider between the first and the second primary electrodes.

4. The high-voltage sensor of claim 3, wherein the at least one electric field sensor axially overlaps with the first primary electrode and with the second primary electrode.

5. The high-voltage sensor of claim 1, wherein the at least one electric field sensor is a local electric field sensor configured to measure the field over only part of an axial extension of the at least one sensing cavity.

6. The high-voltage sensor of claim 1, wherein:
the first set of electrodes corresponds to electrodes $E1_i$ with i=1 ... N1 and the second set of electrodes corresponds to electrodes $E2_i$ with i=1 ... N2.

7. The high-voltage sensor of claim 6, comprising:
a first primary electrode electrically connected to the first contact point; and
a second primary electrode electrically connected to the second contact point, wherein:
the conductive electrodes form a capacitive voltage divider between the first and the second primary electrodes;
a first electrode of the first set forms the first primary electrode; and
a first electrode of the second set forms the second primary electrode.

8. The high-voltage sensor of claim 6, wherein, for each set j of conductive electrodes, the conductive electrodes $Ej_i$ and $Ej_{i+1}$ axially overlap along an overlapping section such that, in the overlapping section, the electrode $Ej_{i+1}$ is arranged radially outside from the electrode $Ej_i$.

9. The high-voltage sensor of claim 6, wherein, for each set j of conductive electrodes,
each conductive electrode has a center end facing the reference plane and a contact end axially opposite to the center end;
the center end of the electrode $Ej_{i+1}$ is closer to the reference plane than the center end of the electrode $Ej_i$, and the contact end of the electrode $Ej_{i+1}$ is closer to the reference plane than the contact end of the electrode $Ej_i$;
the center end of the electrode $Ej_{i+1}$ has an axial distance $Bj_i$ from the center end of the electrode $Ej_i$, and the contact end of the electrode $Ej_{i+1}$ has an axial distance $Cj_i$ from the contact end of the electrode $Ej_i$; and
the electrodes $Ej_i$ and $Ej_{i+1}$ axially overlap between the contact end of the electrode $Ej_{i+1}$ and the center end of the electrode $Ej_i$.

10. The high-voltage sensor of claim 9, wherein, for each set j of electrodes, at least one of:
(i) the axial distance $Bj_i$ is smaller than the axial distance $Cj_i$; and
(ii) each set j of electrodes has at least one of a different i-th axial distance $Bj_i$ and a different i-th axial distance $C1_i$.

11. The high-voltage sensor of claim 9, wherein, for each set j of electrodes, at least one of:
  (i) the axial distances $Bj_i$ are substantially equal to a common distance B, and
  (ii) the axial distances $Cj_i$ are substantially equal to a common distance C.

12. The high-voltage sensor of claim 6, wherein:
  at least one of the conductive electrodes is a shield electrode radially surrounding the at least one sensing cavity; and
  the shield electrode axially overlaps with at least one electrode of the first set and at least one electrode of the second set.

13. The high-voltage sensor of claim 6, wherein at least one of:
  the conductive electrodes are arranged non-symmetrically with respect to the reference plane; and
  the conductive electrodes are embedded in insulator material including different dielectric constants on either side of the reference plane.

14. The high-voltage sensor of claim 6, wherein for at least one sensing cavity, the first set of electrodes forms a first capacitance, and the second set of electrodes forms a second capacitance.

15. The high-voltage sensor of claim 14, wherein at least one of:
  the first capacitance and the second capacitance is made larger than any stray capacitance present in a mounted state of the high-voltage sensor; and
  a ratio of the first and second capacitances is in the range of 1.1 to 1.5.

16. The high-voltage sensor of claim 14, wherein for increasing the first capacitance over the second capacitance, at least one of:
  the first set of electrodes $E1_i$ includes i-th electrodes $E1_i$ having longer axial lengths than the i-th electrodes $E2_i$ of the second set;
  the first set of electrodes $E_i$ includes a different number of electrodes than the second set of electrodes $E2_i$;
  the first set of electrodes $E1_i$ includes a different spacing between the electrodes $E1_i$ as compared to the second set of electrodes $E2_i$;
  selected neighbouring electrodes in at least one of the first and second sets are electrically short-circuited; and
  the first set of electrodes $E1_i$ includes insulation material of higher dielectric constant than insulation material of the second set of electrodes $E2_i$.

17. The high-voltage sensor of claim 6, wherein:
  the electrodes E1i of the first set are equally spaced in the radial direction; and
  the electrodes E2i of the second set are equally spaced in the radial direction.

18. The high-voltage sensor of claim 6, wherein the conductive electrodes are arranged symmetrically with respect to the reference plane.

19. The high-voltage sensor of claim 1, wherein at least part of the conductive electrodes are at least one of (i) substantially cylindrical and (ii) substantially coaxial to each other.

20. The high-voltage sensor of claim 1, wherein the at least one field sensor includes an optical sensor configured to introduce a field-dependent phase shift between a first polarisation or mode and a second polarization or mode of light passing through the optical sensor, and wherein the optical sensor includes one of:
  an electro-optical device with field-dependent birefringence, or a poled waveguide exhibiting a Pockets effect; and
  a piezo-electric device, and a waveguide carrying at least two modes, wherein the waveguide is connected to the piezo-electric device such that a length of the waveguide is field-dependent.

21. The high-voltage sensor of claim 16, wherein the at least one field sensor has two optical output channels having a mutual phase shift that is not a multiple of $\pi$.

22. The high-voltage sensor of claim 1, wherein a first end of the at least one field sensor has a contacting electrode that is electrically connected to the first contact point, and a second end of the at least one field sensor has another contacting electrode that is electrically connected to the second contact point.

23. The high-voltage sensor of claim 22, wherein at least one of:
  at least one of the contacting electrodes includes a front part for accommodating a flexible connection to the electric field sensor; and
  at least one of the contacting electrodes includes a front part having rounded edges for minimizing electric field stress at the end of the at least one electric field sensor and provides a field-free cavity as an air release volume during an embedding procedure of the at least one electric field sensor in the insulating material.

24. The high-voltage sensor of claim 22, wherein at least one of:
  at least one of the contacting electrodes includes centering pins for radially centering the at least one electric field sensor in a bore of the high-voltage sensor; and
  at least one of the contacting electrodes is fabricated from one of an elastic material and an electrically conductive mouldable polymeric material.

25. The high-voltage sensor of claim 22, wherein at least one of:
  at least one of the contacting electrodes includes a back part that provides an internal volume for accommodating an optics assembly for optically connecting the at least one field sensor to an optical cable; and
  the internal volume has a sealing and/or a filling substance for protecting the optics assembly against exposure to the insulating material.

26. The high-voltage sensor of claim 1, wherein:
  the insulator comprises at least one of a solid, liquid, gas, and vacuum; and
  the insulator is placed inside a hollow-core high-voltage outer insulator with an external shed insulator, for accommodating in its hollow core the insulator, which includes the at least one sensing cavity, and a gap external to the insulator for receiving optical fibers is filled.

27. The high-voltage sensor of claim 1, wherein:
  optical fibers are mounted inside a bore of the insulator, which includes the at least one sensing cavity; and
  the bore is filled.

28. The high-voltage sensor of claim 1, wherein:
  the insulator including the at least one sensing cavity has a helical-shaped groove at its outside; and
  optical fibers, including at least one of a return fiber or a transmission fiber for optically connecting further sensor module bodies or other optical sensors, are mounted in the groove and are overmoulded, to form an external shed insulator directly onto the insulator.

29. The high-voltage sensor of claim 1, wherein:
the insulator including the at least one sensing cavity is made out of one of resin-impregnated paper and fiber insulation; and optical fibers are embedded into the one of the resin-impregnated paper and the fiber insulation during winding.

30. The high-voltage sensor of claim 2, wherein:
an outer diameter of the high-voltage sensor is enlarged at axial locations having above-average electric field strength and is reduced at axial locations having below-average electric field strength; and
the diameter is increased around an axial bottom end position of the shield electrode.

31. An assembly comprising several first high-voltage sensors of claim 1 arranged in series with at least one second high voltage sensor.

32. The assembly of claim 31, wherein:
the respective field sensors of the several high-voltage sensors each have two optical output channels having a mutual phase shift that is not a multiple of $\pi$; and
an optical retarder is attributed to only a subset of the field sensors, for adding an additional phase retardation to light passing through the field sensor.

33. The assembly of claim 32, wherein a subset of the field sensors is dimensioned to generate a phase shift that is substantially different from the phase shifts of the remaining field sensors, in particular a phase shift of $\pm\pi/2$ or less at a maximum voltage to be measured of the assembly.

34. The assembly of claim 31, wherein only the first high-voltage sensors are equipped with a field sensor.

35. The assembly of claim 31, wherein the contact points are equipped with metal contacts, and the high-voltage-side uppermost metal contact of the assembly has the largest diameter of all metal contacts.

36. The assembly of claim 31, wherein optical splices for optical fibers are placed inside a hollow volume in a mechanical connection between neighbouring high-voltage sensors.

37. The high-voltage sensor of claim 1, wherein the at least one electric field sensor is arranged in only one of the at least one sensing cavity of the insulator.

38. The high-voltage sensor of claim 4, wherein the at least one electric field sensor is configured to measure a line integral of the field over a length of the at least one electric field sensor.

39. The high-voltage sensor of claim 6, wherein N1=N2.

40. The high-voltage sensor of claim 10, wherein $B1_i \neq B2_i$ and $C1_i \neq C2_i$.

41. The high-voltage sensor of claim 12, wherein the shield electrode axially overlaps with a radially outmost electrode of the first set and a radially outmost electrode of the second set and is arranged radially outside from respective outmost electrodes of the first and the second sets.

42. The high-voltage sensor of claim 20, wherein the electro-optical device with field-dependent birefringence is composed of a material selected from the group consisting of: a crystal, crystalline $Bi_4Ge_3O_{12}$ (BGO) and $Bi_4Si_3O_{12}$ (BSO); and
the piezo-electric device is composed of one of crystalline quartz and piezoelectric ceramic.

43. The high-voltage sensor of claim 21, wherein the at least one field sensor has two optical output channels having a mutual phase shift of substantially $\pi/2$.

44. The high-voltage sensor of claim 23, wherein the flexible connection includes one of a rubber o-ring and silicone; and
the rounded edges provide a field-free cavity as an air release volume during an embedding procedure of the at least one electric field sensor in the insulating material in compressible silicone or polyurethane foam.

45. The high-voltage sensor of claim 26, wherein:
the hollow-core high-voltage outer insulator is made of fiber reinforced epoxy tube;
the external shed insulator is made of silicone elastomer; and
the gap is filled with polyurethane foam.

46. The high-voltage sensor of claim 27, wherein the optical fibers include at least one of a return fiber and a transmission fiber for optically connecting further sensor module bodies or other optical sensors; and
the bore is filled with compressible silicone.

47. The high-voltage sensor of claim 28, wherein the optical fibers include at least one of a return fiber and a transmission fiber for optically connecting further sensor module bodies or other optical sensors; and
the optical fibers are overmoulded by silicone to form the external shed insulator directly onto the insulator.

48. The high-voltage sensor of claim 29, wherein the optical fibers include at least one of a return fiber and a transmission fiber for optically connecting further sensor module bodies or other optical sensors.

49. The assembly of claim 31, wherein the several high-voltage sensors are identical to each other.

50. The assembly of claim 32, wherein the optical retarder is a $\lambda/4$ retarder.

51. The assembly of claim 33, wherein:
the subset of the field sensors includes one field sensor; and
wherein the subset of the field sensors is dimensioned to generate a phase shift of $\pm\pi/2$ or less at a maximum voltage to be measured of the assembly.

52. The assembly of claim 36, wherein a lateral opening is provided in the mechanical connection for giving access to the optical fibers and for splicing the optical fibers.

* * * * *

UNITED STATES PATENT AND TRADEMARK OFFICE
CERTIFICATE OF CORRECTION

PATENT NO. : 9,291,650 B2  
APPLICATION NO. : 13/707263  
DATED : March 22, 2016  
INVENTOR(S) : Stephan Wildermuth et al.

Page 1 of 1

It is certified that error appears in the above-identified patent and that said Letters Patent is hereby corrected as shown below:

On the title page of the Letters Patent, insert

-- (30) Foreign Application Priority Data

June 7, 2010    (EP)    PCT/EP2010/057872 --

Signed and Sealed this  
Twelfth Day of July, 2016

Michelle K. Lee  
*Director of the United States Patent and Trademark Office*